(12) United States Patent
Yanai et al.

(10) Patent No.: US 12,297,381 B2
(45) Date of Patent: May 13, 2025

(54) LAMINATE, RELEASE AGENT COMPOSITION, AND METHOD FOR MANUFACTURING PROCESSED SEMICONDUCTOR SUBSTRATE

(71) Applicant: NISSAN CHEMICAL CORPORATION, Tokyo (JP)

(72) Inventors: Masaki Yanai, Toyama (JP); Takahisa Okuno, Toyama (JP); Hiroto Ogata, Toyama (JP); Shunsuke Moriya, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 228 days.

(21) Appl. No.: 18/010,094

(22) PCT Filed: Jun. 10, 2021

(86) PCT No.: PCT/JP2021/022213
§ 371 (c)(1),
(2) Date: Dec. 13, 2022

(87) PCT Pub. No.: WO2021/256386
PCT Pub. Date: Dec. 23, 2021

(65) Prior Publication Data
US 2023/0265325 A1    Aug. 24, 2023

(30) Foreign Application Priority Data

Jun. 15, 2020 (JP) ................. 2020-103126

(51) Int. Cl.
| | | |
|---|---|---|
| *C09J 183/04* | (2006.01) | |
| *B32B 7/06* | (2019.01) | |
| *B32B 7/12* | (2006.01) | |
| *B32B 9/04* | (2006.01) | |
| *B32B 17/06* | (2006.01) | |
| *B32B 37/12* | (2006.01) | |
| *B32B 37/26* | (2006.01) | |
| *B32B 43/00* | (2006.01) | |
| *C08K 5/56* | (2006.01) | |
| *C09J 7/40* | (2018.01) | |
| *H01L 21/683* | (2006.01) | |

(52) U.S. Cl.
CPC ............ *C09J 183/04* (2013.01); *B32B 7/06* (2013.01); *B32B 7/12* (2013.01); *B32B 37/1284* (2013.01); *B32B 37/26* (2013.01); *B32B 43/006* (2013.01); *C08K 5/56* (2013.01); *C09J 7/401* (2018.01); *B32B 9/04* (2013.01); *B32B 17/06* (2013.01); *B32B 2037/268* (2013.01); *B32B 2255/26* (2013.01); *B32B 2307/412* (2013.01); *B32B 2307/748* (2013.01); *B32B 2309/02* (2013.01); *B32B 2309/12* (2013.01); *B32B 2310/0831* (2013.01); *B32B 2315/08* (2013.01); *B32B 2457/14* (2013.01); *H01L 21/6836* (2013.01)

(58) Field of Classification Search
CPC ............ B32B 17/06; B32B 17/10798; B32B 2037/268; B32B 2250/02; B32B 2255/26; B32B 2307/412; B32B 2307/748; B32B 2309/02; B32B 2309/12; B32B 2310/0831; B32B 2315/08; B32B 2457/14; B32B 37/1284; B32B 37/26; B32B 38/0008; B32B 43/006; B32B 7/06; B32B 7/12; B32B 9/005; B32B 9/04; C08F 120/18; C08K 5/375; C08K 5/56; C09D 133/08; C09J 183/04; C09J 201/00; C09J 7/40; C09J 7/401; H01L 21/02; H01L 21/6836
USPC ... 156/60, 272.2, 275.7, 325, 326, 327, 329, 156/330, 330.9, 331.8, 332, 334, 701, 156/719, 155; 428/411.1, 446, 500, 523
See application file for complete search history.

(56) References Cited

U.S. PATENT DOCUMENTS

| | | | |
|---|---|---|---|
| 5,747,622 A * | 5/1998 | Maeda | ............... G03F 7/0045 528/25 |
| 9,627,235 B2 | 4/2017 | Iwata et al. | |
| 2005/0233547 A1* | 10/2005 | Noda | ............... H01L 21/6835 438/459 |
| 2010/0331477 A1 | 12/2010 | Tamura et al. | |
| 2014/0150972 A1* | 6/2014 | Koellnberger | ...... H01L 21/6835 156/325 |

(Continued)

FOREIGN PATENT DOCUMENTS

| | | |
|---|---|---|
| JP | 2004-043732 | 2/2004 |
| JP | 2004-064040 | 2/2004 |

(Continued)

OTHER PUBLICATIONS

Komiya et al., "Photo-polymerization Reaction of tert-Butyl Acrylate", Proceedings of 56th Academic Lectures N-28, College of Science and Technology, Nihon University, 2012, pp. 1213-1214.

(Continued)

*Primary Examiner* — Philip C Tucker
*Assistant Examiner* — Brian R Slawski
(74) *Attorney, Agent, or Firm* — GREENBLUM & BERNSTEIN, P.L.C.

(57) ABSTRACT

A laminate having a semiconductor substrate, a UV-ray-transmissive support substrate, and an adhesive layer and a release layer disposed between the semiconductor substrate and the support substrate. The release layer is a film formed from a releasing agent composition containing a polymer of an ethylenic unsaturated monomer having a tert-butoxycarbonyl group, a photoacid generator, and a solvent.

6 Claims, No Drawings

(56) References Cited

U.S. PATENT DOCUMENTS

| | | | | |
|---|---|---|---|---|
| 2014/0311680 A1* | 10/2014 | Kubo | ............... | H01L 31/1896 |
| | | | | 428/522 |
| 2016/0168422 A1* | 6/2016 | Iwai | ............... | C09J 4/06 |
| | | | | 522/182 |
| 2016/0332421 A1* | 11/2016 | Yoshioka | ............... | B32B 7/12 |
| 2016/0372358 A1* | 12/2016 | Koma | ............... | C09J 201/02 |
| 2019/0164802 A1 | 5/2019 | Ogino et al. | | |

FOREIGN PATENT DOCUMENTS

| | | |
|---|---|---|
| JP | 2005-023205 | 1/2005 |
| JP | 2005-290146 | 10/2005 |
| JP | 2011-026548 | 2/2011 |
| JP | 2012-106486 | 6/2012 |
| JP | 2019-062001 | 4/2019 |
| WO | 2016/121855 | 8/2016 |
| WO | 2017/221772 | 12/2017 |
| WO | 2019/088103 | 5/2019 |
| WO | 2019/188819 | 10/2019 |

OTHER PUBLICATIONS

International Search Report and Written Opinion of the International Searching Authority issued in International Pat. Appl. No. PCT/JP2021/022213, dated Aug. 17, 2021, along with an English translation thereof.

Extended European Search Report that issued in corresponding European Patent Application No. 21825060.3, dated Jun. 3, 2024.

\* cited by examiner

LAMINATE, RELEASE AGENT COMPOSITION, AND METHOD FOR MANUFACTURING PROCESSED SEMICONDUCTOR SUBSTRATE

TECHNICAL FIELD

The present invention relates to a laminate, to a releasing agent composition, and to a method for producing a processed semiconductor substrate (hereinafter may be referred to as a "processed semiconductor substrate production method").

BACKGROUND ART

Conventionally, electronic elements and wires are 2-dimensionally (within a plane) integrated on a semiconductor wafer. In a trend toward further integration, demand has arisen for a semiconductor integration technique which achieves 3-dimensional integration (i.e., stacking) in addition to 2-dimensional integration. In the technique of 3-dimensional integration, a number of layers are stacked with wire connection by the mediation of through silicon vias (TSVs). In integration of multiple layers, each component wafer to be stacked is thinned by polishing (i.e., grinding) a surface opposite the circuit-furnished surface (i.e., a back surface), and the thus-thinned semiconductor wafers are stacked.

Before thinning, the semiconductor wafer (may also be called simply "wafer") is fixed to a support for facilitating polishing by means of a polishing machine (i.e., grinder). Since the fixation must be easily removed after polishing, the fixation is called temporary bonding. Temporary bonding must be easily removed from the support. When such temporary bonding is removed by excessive force, in some cases a thinned semiconductor wafer may be broken or deformed. In order to prevent such a phenomenon, the temporarily bonded support is detached in a gentle manner. However, from another aspect, it is not preferred that the temporarily bonded support be removed or slid by a stress applied during polishing of the back surface of the semiconductor wafer. Therefore, temporary bonding must withstand the stress during polishing and must be easily removed after polishing.

Under such circumstances, one required performance includes having high stress (i.e., strong adhesion) within the plane during polishing and low stress (i.e., weak adhesion) toward the thickness direction during detachment.

Regarding the above-mentioned procedure, there have been reported various techniques for a bonding and debonding process based on light exposure (see, for example, Patent Documents 1 and 2). However, according to a recent further development in the semiconductor field, there is continuous demand for a new technique involved in debonding through exposure to light (e.g., a UV ray).

PRIOR ART DOCUMENTS

Patent Documents

Patent Document 1: Japanese Patent Application Laid-Open (kokai) No. 2004-64040
Patent Document 2: Japanese Patent Application Laid-Open (kokai) No. 2012-106486
Patent Document 3: Japanese Patent Application Laid-Open (kokai) No. 2004-43732
Patent Document 4: WO 2016/121855

Non-Patent Documents

Non-Patent Document 1: "Photopolymerization of t-Butyl Acrylate," Proceedings of 56th Academic Lectures N-28, College of Science and Technology, Nihon University, the Academic Year 2012.

SUMMARY OF THE INVENTION

Problems to be Solved by the Invention

The present invention has been conceived under such circumstances. Thus, an object of the present invention is to provide a laminate having a release layer which exhibits excellent heat resistance during joining of a semiconductor substrate to a support substrate, processing of the back surface of the semiconductor substrate, and a device-mounting process or a like process, and which can be easily debonded through irradiation with an UV ray and subsequent heating. Another object of the present invention is to provide a releasing agent composition which provides a film suitably serving as such a release layer. Still another object is to provide a processed semiconductor substrate production method employing such a laminate.

Means for Solving the Problems

The present inventors have conducted extensive studies for solving the problems, and have found that the above objects can be attained by providing a laminate having a semiconductor substrate, a support substrate which allows passage of a UV ray (hereinafter referred to as a UV-ray-transmissive support substrate), and an adhesive layer and a release layer disposed between the semiconductor substrate and the support substrate, wherein the release layer is a film formed from a releasing agent composition containing a polymer of an ethylenic unsaturated monomer having a tert-butoxycarbonyl group, a photoacid generator, and a solvent. The present invention has been accomplished on the basis of this finding.

Notably, Patent Document 3 discloses a specific composition containing a foaming component having a t-butyloxycarbonyl moiety. Patent Document 4 discloses a specific composition containing a polymer of an ethylenic unsaturated monomer having a tert-butoxycarbonyl group, and a urethane (meth)acrylate compound. Non-Patent Document 1 discloses a resin having a tert-butoxycarbonyl group which generates gas through decomposition under acidic conditions. However, none of the documents specifically discloses the laminate of the present invention, the releasing agent composition for a specific use of the present invention, or the processed semiconductor substrate production method of the present invention.

Accordingly, the present invention provides the following.
1. A laminate comprising
a semiconductor substrate,
a UV-ray-transmissive support substrate, and
an adhesive layer and a release layer disposed between the semiconductor substrate and the support substrate, characterized in that
the release layer is a film formed from a releasing agent composition containing a polymer of an ethylenic unsaturated monomer having a tert-butoxycarbonyl group, a photoacid generator, and a solvent.

2. A laminate according to 1 above, wherein the ethylenic unsaturated monomer having a tert-butoxycarbonyl group includes at least one species selected from the group consisting of formulas (T1) to (T3):

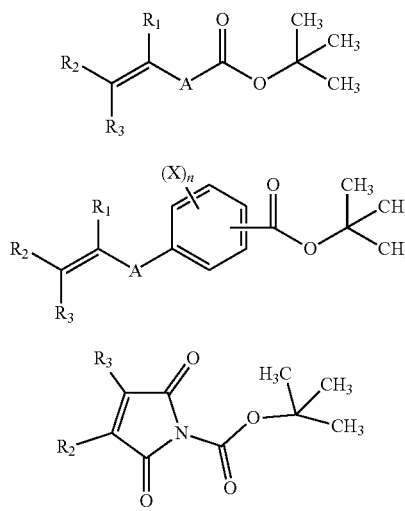

8. A releasing agent composition according to 7 above, wherein the ethylenic unsaturated monomer having a tert-butoxycarbonyl group includes at least one species selected from the group consisting of formulas (T1) to (T3):

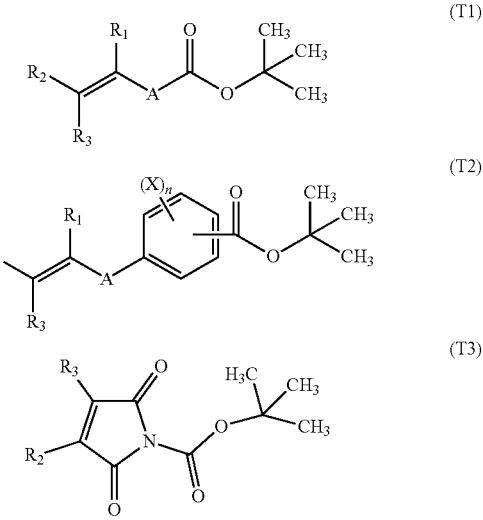

(wherein $R_1$ independently represents a hydrogen atom, a cyano group, a methyl group, an ethyl group, an n-propyl group, or an isopropyl group;

each of $R_2$ and $R_3$ independently represents a hydrogen atom or a C1 to C10 alkyl group;

A independently represents a single bond, an ether group (—O—), a carbonyl group (—CO—), an amido group (—CONH—), a C1 to C12 alkylene group, a C6 to C16 arylene group, or a C3 to C12 heteroarylene group;

X independently represents a halogen atom, a cyano group, a nitro group, a C1 to C10 alkyl group, or a C1 to C10 haloalkyl group; and n is the number of a substituent or substituents X of the benzene ring and an integer of 0 to 4).

3. A laminate according to 1 above, wherein the ethylenic unsaturated monomer having a tert-butoxycarbonyl group includes tert-butyl (meth)acrylate.

4. A laminate according to any of 1 to 3 above, wherein the adhesive layer is a film formed from an adhesive composition containing an adhesive component (S) containing at least one species selected from among a polysiloxane adhesive, an acrylic resin adhesive, an epoxy resin adhesive, a polyamide adhesive, a polystyrene adhesive, a polyimide adhesive, and a phenolic resin adhesive.

5. A laminate according to 4 above, wherein the adhesive component (S) contains a polysiloxane adhesive.

6. A laminate according to 5 above, wherein the polysiloxane adhesive contains a polyorganosiloxane component (A) which is curable through hydrosilylation.

7. A releasing agent composition for forming a release layer of a laminate comprising a semiconductor substrate, a UV-ray-transmissive support substrate, and an adhesive layer and the release layer disposed between the semiconductor substrate and the support substrate, the composition comprising a polymer of an ethylenic unsaturated monomer having a tert-butoxycarbonyl group, a photoacid generator, and a solvent.

(wherein $R_1$ independently represents a hydrogen atom, a cyano group, a methyl group, an ethyl group, an n-propyl group, or an isopropyl group;

each of $R_2$ and $R_3$ independently represents a hydrogen atom or a C1 to C10 alkyl group;

A independently represents a single bond, an ether group (—O—), a carbonyl group (—CO—), an amido group (—CONH—), a C1 to C12 alkylene group, a C6 to C16 arylene group, or a C3 to C12 heteroarylene group;

X independently represents a halogen atom, a cyano group, a nitro group, a C1 to C10 alkyl group, or a C1 to C10 haloalkyl group; and n is the number of a substituent or substituents X of the benzene ring and an integer of 0 to 4).

9. A releasing agent composition according to 7 above, wherein the ethylenic unsaturated monomer having a tert-butoxycarbonyl group includes tert-butyl (meth) acrylate.

10. A releasing agent composition according to any of 7 to 9 above, wherein the adhesive layer is a film formed from an adhesive composition containing an adhesive component (S) containing at least one species selected from among a polysiloxane adhesive, an acrylic resin adhesive, an epoxy resin adhesive, a polyamide adhesive, a polystyrene adhesive, a polyimide adhesive, and a phenolic resin adhesive.

11. A releasing agent composition according to 10 above, wherein the adhesive component (S) contains a polysiloxane adhesive.

12. A releasing agent composition according to 11 above, wherein the polysiloxane adhesive contains a polyorganosiloxane component (A) which is curable through hydrosilylation.

13. A processed semiconductor substrate production method comprising:

a first step of processing a semiconductor substrate of a laminate comprising the semiconductor substrate, a UV-ray-transmissive support substrate, and an adhesive layer and a release layer disposed between the semiconductor substrate and the support substrate, wherein the release layer is a film formed from a releasing agent composition containing a polymer of an ethylenic unsaturated monomer having a tert-butoxycarbonyl group, a photoacid generator, and a solvent;

after the first step, a second step of irradiating the release layer with a UV ray from the support substrate side; and after the second step, a third step of heating the release layer.

14. A processed semiconductor substrate production method according to 13 above, wherein the ethylenic unsaturated monomer having a tert-butoxycarbonyl group includes at least one species selected from the group consisting of formulas (T1) to (T3):

[F3]

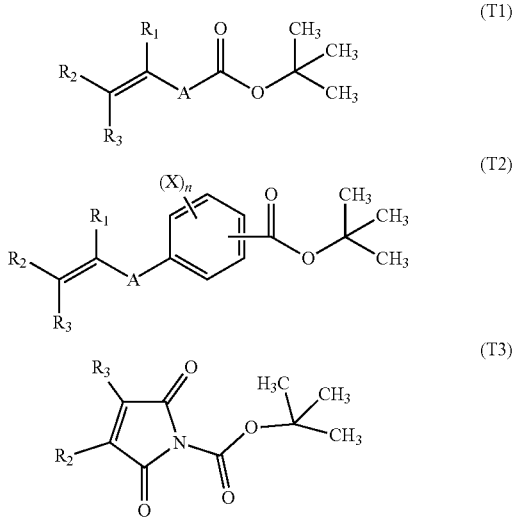

(wherein $R_1$ independently represents a hydrogen atom, a cyano group, a methyl group, an ethyl group, an n-propyl group, or an isopropyl group;

each of $R_2$ and $R_3$ independently represents a hydrogen atom or a C1 to C10 alkyl group;

A independently represents a single bond, an ether group (—O—), a carbonyl group (—CO—), an amido group (—CONH—), a C1 to C12 alkylene group, a C6 to C16 arylene group, or a C3 to C12 heteroarylene group;

X independently represents a halogen atom, a cyano group, a nitro group, a C1 to C10 alkyl group, or a C1 to C10 haloalkyl group; and n is the number of a substituent or substituents X of the benzene ring and an integer of 0 to 4).

15. A processed semiconductor substrate production method according to 13 above, wherein the ethylenic unsaturated monomer having a tert-butoxycarbonyl group includes tert-butyl (meth)acrylate.

16. A processed semiconductor substrate production method according to any of 13 to 15 above, wherein the adhesive layer is a film formed from an adhesive composition containing an adhesive component (S) containing at least one species selected from among a polysiloxane adhesive, an acrylic resin adhesive, an epoxy resin adhesive, a polyamide adhesive, a polystyrene adhesive, a polyimide adhesive, and a phenolic resin adhesive.

17. A processed semiconductor substrate production method according to 16 above, wherein the adhesive component (S) contains a polysiloxane adhesive.

18. A processed semiconductor substrate production method according to 17 above, wherein the polysiloxane adhesive contains a polyorganosiloxane component (A) which is curable through hydrosilylation.

Effects of the Invention

The laminate of the present invention has a semiconductor substrate, a UV-ray-transmissive support substrate, and an adhesive layer and a release layer disposed between the semiconductor substrate and the support substrate, wherein the release layer is a film formed from a releasing agent composition containing a polymer of an ethylenic unsaturated monomer having a tert-butoxycarbonyl group, a photoacid generator, and a solvent. Through irradiation of the release layer with a UV ray from the support substrate side and heating the UV-irradiated release layer, elimination reaction from the tert-butoxycarbonyl group suitably occurs in the release layer, to thereby achieve excellent debonding performance. One possible reason why such excellent debonding performance can be attained is as follows. When the heat treatment is performed after UV irradiation, separation or decomposition of the release layer suitably occurs at the interface between the release layer and the adjacent layer such as the adhesive layer, at the interface between the release layer and the support layer or the semiconductor substrate, or in the release layer.

By use of the laminate of the present invention having the aforementioned properties, in one case where a processed silicon wafer (i.e., a backside-processed semiconductor substrate) is separated from a support substrate (i.e., a glass substrate) after processing, the processed silicon wafer can be readily removed by irradiating the laminate with a UV ray from the support substrate side and performing post-heat treatment. As a result, mechanical stress to the silicon wafer can be avoided, whereby damage (e.g., warpage or deformation) of the silicon wafer can be prevented. Furthermore, the release layer included in the laminate of the present invention does not generate considerable amounts of gas and heat, which would possibly cause adverse effects while exerting the debonding performance of the release layer. Therefore, the severe effect on the semiconductor substrate is reduced. Thus, more reliable production of semiconductor elements can be expected by use of the laminate of the present invention.

The releasing agent composition of the present invention contains a polymer of ethylenic unsaturated monomers each having a tert-butoxycarbonyl group and a photoacid generator. Thus, when a film produced from the composition is irradiated with a UV ray and heated after irradiation, elimination reaction from the tert-butoxycarbonyl group suitably proceeds in the film, to thereby achieve enhanced debonding performance. Thus, when a film formed from the releasing agent composition of the present invention serving as the release layer is provided in combination with the adhesive layer between the semiconductor substrate and the support substrate, there can be produced a laminate which can be suitably debonded by irradiating the release layer with a UV ray and performing post-heat treatment, without applying excessive load for debonding to workpieces to be processed such as a support substrate and a semiconductor substrate.

MODES FOR CARRYING OUT THE INVENTION

The laminate of the present invention has a semiconductor substrate, a UV-ray-transmissive support substrate, and an adhesive layer and a release layer disposed between the semiconductor substrate and the support substrate, wherein the release layer is a film formed from a releasing agent composition containing a polymer of an ethylenic unsaturated monomer having a tert-butoxycarbonyl group, a photoacid generator, and a solvent.

The semiconductor substrate is, for example, a wafer. No particular limitation is imposed on the semiconductor substrate, and a specific example thereof is a silicon wafer having a diameter of about 300 mm and a thickness of about 770 μm.

No particular limitation is imposed on the support substrate, so long as the substrate serves as a support (carrier) which is joined to sustain the semiconductor substrate and which allows passage of a UV ray.

In the present invention, the term "UV ray" refers to light having a wavelength ranging from 100 nm to 400 nm. For example, a preferred wavelength of the UV ray is 308 nm, 343 nm, 355 nm, or 365 nm. Notably, the light employed in debonding may include light other than UV rays such as visible light.

The transmittance of the UV-ray-transmissive support substrate is generally 50% or higher, preferably 60% or higher, more preferably 70% or higher, yet more preferably 80% or higher, still more preferably 90% or higher.

No particular limitation is imposed on the UV-ray-transmissive support substrate, and one example thereof is a glass wafer having a diameter of about 300 mm and a thickness of about 700 μm.

In a preferred mode, the laminate of the present invention includes a semiconductor substrate, a UV-ray-transmissive support substrate, an adhesive layer disposed between the semiconductor substrate and the support substrate so as to come into contact with the semiconductor substrate, and a release layer disposed so as to come into contact with the support substrate and the adhesive layer. Alternatively, the laminate has a release layer disposed so as to come into contact with the semiconductor substrate, and an adhesive layer so as to come into contact with the support substrate and the release layer. That is, in a preferred mode, the laminate has a semiconductor substrate, a support substrate, and two layers between the semiconductor substrate and the support substrate, wherein one of the two layers is an adhesive layer, and the other is a release layer.

The laminate of the present invention can be debonded by irradiating the release layer with a UV ray from the UV-ray-transmissive support substrate side and subsequently heating the laminate. Thus, debonding can be achieved without applying excessive load for peeling. As a result, the semiconductor substrate can be successfully separated from the support substrate.

In other words, the release layer included in the laminate of the present invention exhibits enhanced debonding performance through UV irradiation and post heat treatment, as compared with the state before irradiation and heating. In the laminate of the present invention, the semiconductor substrate (e.g., a silicon wafer) is suitably supported by a UV-ray-transmissive support substrate (e.g., a glass wafer) by the mediation of the adhesive layer and the release layer, while processing (e.g., thinning) of the silicon wafer is performed. After completion the processing, the laminate is irradiated with a UV ray from the support substrate side, whereby the UV ray passing through the support substrate is absorbed by the release layer. Further, through heating the release layer, separation or decomposition of the release layer occurs at the interface between the release layer and the adhesive layer, at the interface between the release layer and the support layer or the semiconductor substrate, or in the release layer. As a result, debonding can be suitably achieved without applying excessive load for peeling.

As described above, the release layer included in the laminate of the present invention is a film formed from a releasing agent composition containing a polymer of ethylenic unsaturated monomers each having a tert-butoxycarbonyl group, a photoacid generator, and a solvent.

The ethylenic unsaturated monomer having a tert-butoxycarbonyl group is an ethylenic unsaturated monomer having in the molecule thereof a group represented by formula (1). Through UV irradiation, an acid is generated by the acid-generator, which invokes elimination reaction (gas generation reaction) from the tert-butoxycarbonyl group. As a result, the film serving as the release layer decomposes, to thereby enhance debondability. These ethylenic unsaturated monomers each having a tert-butoxycarbonyl group may be used singly or in combination of two or more species.

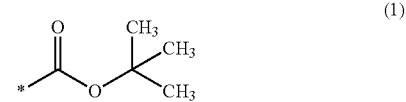 [SMILES: *C(=O)OC(C)(C)C]

(wherein the symbol "*" represents a bonding site)

The group represented by formula (1) may be directly bonded to a carbon atom forming an ethylenic unsaturated bond of the monomer in which the group is present, or indirectly bonded by the mediation of another atom or group.

For example, in the present invention, examples of preferred ethylenic unsaturated monomers each having a tert-butoxycarbonyl group include ethylenic unsaturated monomers represented by formula (T1) to (T3).

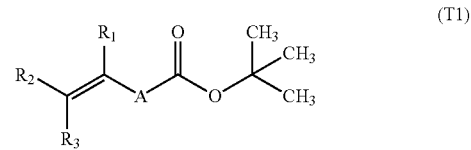

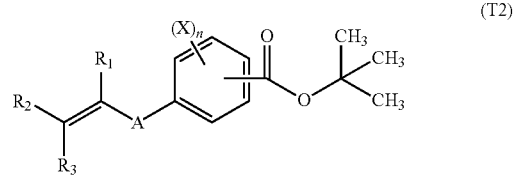

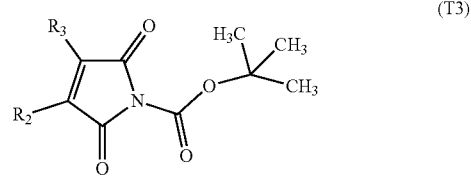

$R_1$ independently represents a hydrogen atom, a cyano group, a methyl group, an ethyl group, an n-propyl group, or an isopropyl group. Among them, a hydrogen atom or a methyl group is preferred, from the viewpoint of availability of the corresponding compound or a source of the compound.

Each of $R_2$ and $R_3$ independently represents a hydrogen atom or a C1 to C10 alkyl group.

The C1 to C10 alkyl group may be linear-chain, branched, or cyclic. Examples thereof include C1 to C10 linear-chain or branched alkyl groups such as methyl, ethyl, n-propyl, isopropyl, n-butyl, isobutyl, sec-butyl, tert-butyl, n-pentyl, n-hexyl, n-heptyl, n-octyl, n-nonyl, and n-decyl; and C3 to C10 cycloalkyl groups such as cyclopropyl, cyclobutyl, cyclopentyl, cyclohexyl, cycloheptyl, cyclooctyl, cyclononyl, cyclodecyl, bicyclobutyl, bicyclopentyl, bicyclohexyl, bicycloheptyl, bicyclooctyl, bicyclononyl, and bicyclodecyl.

Among them, each of $R_2$ and $R_3$ is preferably a hydrogen atom or a C1 to C10 linear-chain alkyl group, more preferably a hydrogen atom, a methyl group, or an ethyl group, still more preferably a hydrogen atom, a methyl group, yet more preferably a hydrogen atom, from the viewpoint of availability of the corresponding compound or a source of the compound.

A independently represents a single bond, an ether group (—O—), a carbonyl group (—CO—), an amido group (—CONH—), a C1 to C12 alkylene group, a C6 to C16 arylene group, or a C3 to C12 heteroarylene group.

The C1 to C12 alkylene group include groups derived through removal of further one hydrogen atom from the C1 to C12 alkyl group. Specific examples of such an alkyl group include those described above.

Specific examples of the C1 to C12 alkylene group include, but are not limited to, methylene, ethylene, trimethylene, 2,2-propanediyl, tetramethylene, pentamethylene, hexamethylene, heptamethylene, octamethylene, nanomethylene, and decamethylene.

The C6 to C16 arylene group include groups derived through removal of two hydrogen atoms from the C6 to C16 aryl group. Specific examples of such an arylene include benzene, naphthalene, and anthracene.

Specific examples of the C1 to C16 arylene group include, but are not limited to, o-phenylene, m-phenylene, p-phenylene, naphthalene-1,2-diyl, naphthalene-1,3-diyl, naphthalene-1,4-diyl, naphthalene-1,5-diyl, naphthalene-1,6-diyl, naphthalene-1,7-diyl, naphthalene-1,8-diyl, naphthalene-2,3-diyl, naphthalene-2,6-diyl, and naphthalene-2,7-diyl.

The C3 to C12 heteroarylene group include groups derived through removal of two hydrogen atoms from the corresponding heteroaryl group. Specific examples of such a heteroarylene include an oxygen-containing heteroarylene such as furan; a sulfur-containing heteroarylene such as thiophene; and a nitrogen-containing heteroarylene such as pyridine, triazine, and imidazole.

Specific examples of the C3 to C12 heteroarylene group include, but are not limited to, furan-2,3-diyl, furan-2,4-diyl, furan-2,5-diyl, furan-3,4-diyl, thiophene-2,3-diyl, thiophene-2,4-diyl, thiophene-2,5-diyl, thiophene-3,4-diyl, imidazole-2,4-diyl, imidazole-4,5-diyl, pyridine-2,3-diyl, pyridine-2,4-diyl, pyridine-2,5-diyl, pyridine-2,6-diyl, pyridine-3,4-diyl, pyridine-3,5-diyl, and triazine-2,4-diyl.

Among them, the group A is preferably a single bond, an ether group, a carbonyl group, an amido group, a C1 to C8 alkylene group, or a C6 to C12 arylene group, more preferably a single bond, an ether group, a carbonyl group, an amido group, a C1 to C4 alkylene group, an o-phenylene group, a m-phenylene group, or a p-phenylene group, still more preferably a single bond, an ether group, a carbonyl group, an amido group, a methylene group, an ethylene group, a trimethylene group, a 2,2-propanediyl group, a m-phenylene group, or a p-phenylene group, from the viewpoint of availability of the corresponding compound or a source of the compound. Also, from the viewpoint of gas generation property of the relevant compound, A is preferably a single bond, an ether group, or a carbonyl group.

Notably, in formula (T2), the bonding position of the tert-butoxycarbonyl group is preferably a p-position with respect to A.

X is a substituent of the benzene ring and independently represents a halogen atom, a cyano group, a nitro group, a C1 to C10 alkyl group, or a C1 to C10 haloalkyl group.

Examples of the halogen atom include a fluorine atom, a chlorine atom, and a bromine atom.

Examples of the C1 to C10 haloalkyl group include a trifluoromethyl group, a 2,2,2-trifluoroethyl group, a 1,1,2,2,2-pentafluoroethyl group, a 3,3,3-trifluoropropyl group, 2,2,3,3,3-pentafluoropropyl group, a 1,1,2,2,3,3,3-heptafluoropropyl group, a 4,4,4-trifluorobutyl group, a 3,3,4,4,4-pentafluorobutyl group, a 2,2,3,3,4,4,4-heptafluorobutyl group, and a 1,1,2,2,3,3,4,4,4-nanofluorobutyl group.

Specific examples of the C1 to C10 alkyl group include those as described above.

The parameter "n" is the number of a substituent or substituents X of the benzene ring and an integer of 0 to 4)

Among them, X is preferably a halogen atom, a cyano group, a nitro group, a methyl group, an ethyl group, a propyl group, an isopropyl group, a halomethyl group, a haloethyl group, a halopropyl group, or a haloisopropyl group, more preferably a halogen atom, a cyano group, a nitro group, a methyl group, an ethyl group, a halomethyl group, or a haloethyl group, from the viewpoint of availability of the corresponding compound or a source of the compound. Also, the parameter "n" is preferably 0 to 2, more preferably 0 or 1, optimally 0.

Specific examples of the ethylenic unsaturated monomer having a tert-butoxycarbonyl group include, but are not limited to, tert-butyl (meth)acrylate, N-(tert-butoxycarbonyl) (meth)acrylamide, 4-tert-butoxystyrene, tert-butyl 4-vinylphenylcarbonate, tert-butyl (4-vinylphenyl)carbamate, tert-butyloxycarbonyl (meth)acrylate, N-(tert-butyloxycarbonyl)maleimide, and 2-(tert-butoxycarbonylamino)ethyl acrylate.

Notably, as used herein, the term "(meth)acrylate" encompasses an acrylate and a methacrylate. Thus, for example, the expression tert-butyl (meth)acrylate encompasses both tert-butyl acrylate and tert-butyl methacrylate.

In the present invention, the polymer of ethylenic unsaturated monomer having tert-butoxycarbonyl groups which polymer is contained in the releasing agent composition may include an ethylenic unsaturated monomer unit other than the ethylenic unsaturated monomer having a tert-butoxycarbonyl group, so as to control the strength of the film formed therefrom, reactivity of the formed polymer, etc.

The ethylenic unsaturated monomer other than the ethylenic unsaturated monomer having a tert-butoxycarbonyl group is an ethylenic unsaturated monomer not having the group represented by formula (1). Specific examples of the ethylenic unsaturated monomer having no group represented by formula (1) include a mono-functional (meth)acrylate having no group represented by formula (1) and a 2≥functional (meth)acrylate having no group represented by formula (1). These ethylenic unsaturated monomers other than the ethylenic unsaturated monomer having a tert-butoxycarbonyl group may be used singly or in combination of two or more species.

The mono-functional (meth)acrylate is preferably a mono-functional alkyl (meth)acrylate, more preferably a mono-functional alkyl (meth)acrylate having a C≥6 alkyl group.

The alkyl group may be linear-chain, branched, or cyclic. Examples thereof include C1 to C20 linear-chain or branched alkyl groups such as methyl, ethyl, n-propyl, isopropyl, n-butyl, isobutyl, sec-butyl, n-pentyl, n-hexyl, n-heptyl, n-octyl, n-nonyl, and n-decyl; and C3 to C20 cyclic alkyl groups such as cyclopropyl, cyclobutyl, cyclopentyl, cyclohexyl, cycloheptyl, cyclooctyl, cyclononyl, cyclodecyl, bicyclobutyl, bicyclopentyl, bicyclohexyl, bicycloheptyl, bicyclooctyl, bicyclononyl, and bicyclodecyl.

Specific examples of the mono-functional alkyl (meth)acrylate having a C≥6 alkyl group include hexyl (meth)acrylate, 2-ethylhexyl (meth)acrylate, heptyl (meth)acrylate, octyl (meth)acrylate, isooctyl (meth)acrylate, nonyl (meth)acrylate, isononyl (meth)acrylate, decyl (meth)acrylate, isodecyl (meth)acrylate, dodecyl (meth)acrylate, stearyl (meth)acrylate, isostearyl (meth)acrylate, lauryl (meth)acrylate, cyclohexyl (meth)acrylate, isobornyl (meth)acrylate, isoamyl (meth)acrylate, dicyclopentenyl (meth)acrylate, and tricyclodecanyl (meth)acrylate.

Also, specific examples of the (meth)acrylate other than such mono-functional alkyl (meth)acrylates having a C≥6 alkyl group include methyl (meth)acrylate, ethyl (meth)acrylate, phenoxyethyl (meth)acrylate, glycerin mono(meth)acrylate, glycidyl (meth)acrylate, n-butyl (meth)acrylate, benzyl (meth)acrylate, ethylene oxide-modified (n=2) phenol (meth)acrylate, propylene oxide-modified (n=2.5) nonylphenol (meth)acrylate, 2-(meth)acryloyloxyethyl acid phosphate, furfuryl (meth)acrylate, carbitol (meth)acrylate, benzyl (meth)acrylate, butoxyethyl (meth)acrylate, allyl (meth)acrylate, 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-hydroxy-3-phenoxypropyl (meth)acrylate, and 3-chloro-2-hydroxypropyl (meth)acrylate. Among them, such (meth)acrylates having no hydroxyl group are preferred. The molecular weight of the (meth)acrylate is preferably about 100 to about 300.

These mono-functional (meth)acrylates may be used singly or in combination of two or more species.

Among them, isodecyl (meth)acrylate, lauryl (meth)acrylate, cyclohexyl (meth)acrylate, isostearyl (meth)acrylate, and 2-ethylhexyl (meth)acrylate are preferred.

Examples of the 2≥functional (meth)acrylate include a bi-functional (meth)acrylate and a 3≥functional (meth)acrylate.

Examples of the bi-functional (meth)acrylate include ethylene glycol di(meth)acrylate, diethylene glycol di(meth)acrylate, tetraethylene glycol di(meth)acrylate, polyethylene glycol di(meth)acrylate, propylene glycol di(meth)acrylate, dipropylene glycol di(meth)acrylate, polypropylene glycol di(meth)acrylate, butylene glycol di(meth)acrylate, neopentyl glycol di(meth)acrylate, ethylene oxide-modified bisphenol A-type di(meth)acrylate, propylene oxide-modified bisphenol A-type di(meth)acrylate, 1,6-hexanediol di(meth)acrylate, glycerin di(meth)acrylate, pentaerythritol di(meth)acrylate, ethylene glycol diglycidyl ether di(meth)acrylate, diethylene glycol diglycidyl ether di(meth)acrylate, phthalic acid diglycidyl ester di(meth)acrylate, and hydroxypyvalic acid-modified neopentyl glycol di(meth)acrylate.

Examples of the 3≥functional (meth)acrylate include trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, tri(meth)acryloyloxyethoxytrimethylolpropane, and glycerin polyglycidyl ether poly(meth)acrylate.

In the present invention, from the viewpoint of realizing suitable debonding at high reproducibility, the relative amount (with respect to all units in the polymer) of ethylenic unsaturated monomer unit(s) other than the ethylenic unsaturated monomer having a tert-butoxycarbonyl group is generally 50 mol % or less, preferably 40 mol % or less, more preferably 30 mol % or less, still more preferably 20 mol % or less, yet more preferably 10 mol % or less, further more preferably 5 mol % or less.

In a preferred embodiment of the present invention, from the viewpoint of realizing suitable debonding at high reproducibility, the polymer is formed only of ethylenic unsaturated monomer units having a tert-butoxycarbonyl group.

That is, in the present invention, the relative amount of monomer units (with respect to all units in the polymer) represented by, for example, any of formulas (M1) to (M3), is generally 50 mol % or more, preferably 60 mol % or more, more preferably 70 mol % or more, still more preferably 80 mol % or more, yet more preferably 90 mol % or more, further more preferably 95 mol % or more.

In a preferred mode of the present invention, from the viewpoint of realizing suitable debonding at high reproducibility, the polymer is formed only of a monomer unit represented by any of formulas (M1) to (M3), preferably a monomer represented by formula (M1).

Notably, in the present invention, the expression "formed only of a monomer unit" refers to that the polymer is derived from the relevant monomer as a single monomer species, and the resultant polymer is substantially formed only of the monomer unit. However, the above meaning may allow the case where the presence, in the formed polymer, of a microamount of a unit originating from an impurity contained in the entire monomer(s), or a unit originating from unintended structural change or decomposition during or after the polymerization.

[F6]

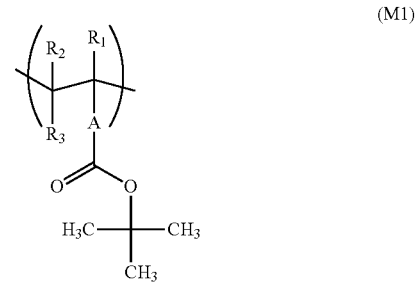

(M1)

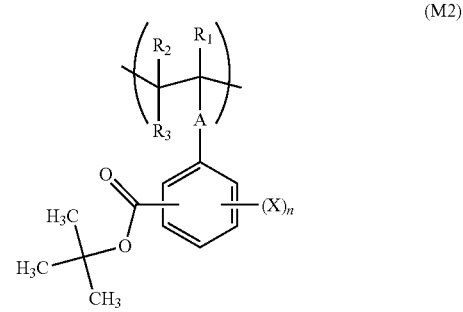

(M2)

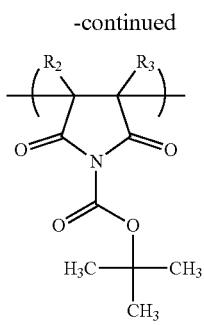

(M3)

(wherein $R_1$ to $R_3$, A, X, and n are as the same as defined above)

The polymer employed in the present invention may be produced through polymerization of the aforementioned monomer(s) in the presence of a radical polymerization initiator.

So long as the radical polymerization initiator can release a substance which can initiate radical polymerization through irradiation with light and/or application of heat, examples thereof include, but are not limited to, a benzophenone compound, an acetophenone compound, a benzoin ether compound, a thioxanthone compound, an azo compound, a peroxide, a sulfonium salt, a iodonium salt, and a persulfate salt.

Specific examples include, but are not limited to, benzophenone, 1,3-di(tert-butyldioxycarbonyl)benzophenone, 3,3',4,4'-tetrakis(tert-butyldioxycarbonyl)benzophenone, 3-phenyl-5-isoxazolone, 2-mercaptobenzimidazole, bis(2,4,5-triphenyl)imidazole, 2,2-dimethoxy-1,2-diphenylethan-1-one, 1-hydroxycyclohexylphenyl ketone, 2-benzyl-2-dimethylamino-1-(4-morpholinophenyl)-butan-1-one, acetyl peroxide, benzoyl peroxide, methyl ethyl ketone peroxide, cyclohexanone peroxide, hydrogen peroxide, tert-butyl hydroperoxide, cumene hydroperoxide, di-tert-butyl peroxide, dicummyl peroxide, dilauroyl peroxide, tert-butyl peroxyacetate, tert-butyl peroxypyvalate, tert-butyl peroxy-2-ethylhexanoate, 2,2'-azobisisobutyronitrile, 2,2'-azobis(2,4-dimethylvaleronitrile), (1-phenylethyl)azodiphenylmethane, 2,2'-azobis(4-methoxy-2,4-dimethylvaleronitrile), dimethyl 2,2'-azobisisobutyrate, 2,2'-azobis(2-methylbutyronitrile), 1,1'-azobis (1-cyclohexanecarbonitrile), 2-(carbamoylazo) isobutyronitrile, 2,2'-azobis(2,4,4-trimetylpentane), 2-phenylazo-2,4-dimethyl-4-methoxyvaleronitrile, 2,2'-azobis(2-methylpropane), ammonium persulfate, sodium persulfate, and potassium persulfate.

The amount of the radical polymerization initiator used in the invention is generally 1 to 3 mass %, with respect to the aforementioned monomer(s).

The polymerization reaction of the aforementioned monomer(s) may be carried out in a solvent so as to yield a target polymer at high efficiency or for other purposes. No particular limitation is imposed on the solvent, so long as it provides no adverse effects such as impeding the reaction. However, when the below-mentioned glycol solvent is used as a solvent for polymerization, the reaction mixture containing the formed polymer can be used as is for preparation of the aforementioned releasing agent composition, without isolating the formed polymer. Thus, the below-mentioned glycol solvent(s) is/are preferred.

The time and temperature of polymerization reaction of the aforementioned monomer(s) are appropriately determined in consideration of the target molecular weight of the polymer to be formed, the reactivity and amount of the initiator used, the boiling point of the solvent used, and other factors. The reaction temperature and time generally fall within ranges of 50 to 150° C. and 5 minutes to 72 hours.

If needed, the aforementioned polymer is isolated and purified through a customary method, before preparation of the releasing agent composition.

From the viewpoint of, for example, realizing suitable debonding at high reproducibility, the weight average molecular weight (Mw) of the aforementioned polymer is generally 1,000 to 200,000. From the viewpoint of, for example, suppressing deposition of the polymer so as to produce a releasing agent composition with high storage stability at high reproducibility, the molecular weight (Mw) is preferably 150,000 or lower, more preferably 100,000 or lower, still more preferably 75,000 or lower. From the viewpoint of, for example, enhancing the film strength to thereby produce a release layer having high uniformity at high reproducibility, the molecular weight (Mw) is preferably 5,000 or higher, more preferably 10,000 or higher, still more preferably 20,000 or higher. The polydispersity (Mw/Mn) of the aforementioned polymer is generally 2 to 6.

The weight average molecular weight, number average molecular weight, and polydispersity of the aforementioned polymer may be determined by means of, for example, HLC-8320GPC (product of Tosoh Corporation) and a column (TSKgel SuperMultiporeHZ-N, product of Tosoh Corporation) (column temperature: 40° C., flow rate: 0.35 mL/min, eluent: tetrahydrofuran, and standard sample: polystyrene (product of Showa Denko K. K.).

The releasing agent composition contains a photoacid generator.

Examples of the photoacid generator include an onium salt compound, a sulfonimide compound, and a disulfonyldiazomethane compound.

Specific examples of the onium salt compound include, but are not limited to, iodonium salt compounds, such as diphenyliodonium hexafluorophosphate, diphenyliodonium trifluoromethanesulfonate, diphenyliodonium nonafluoro-normal-butanesulfonate, diphenyliodonium perfluoro-n-octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoro-normal-butanesulfonate, triphenylsulfonium camphorsulfonate, and triphenylsulfonium trifluoromethanesulfonate.

Specific examples of the sulfonimide compound include, but are not limited to, N-(trifluoromethanesulfonyloxy)succinimide, N-(nonafluoro-normal-butanesulfonyloxy)succinimide, N-(camphorsulfonyloxy)succinimide, and N-(trifluoromethanesulfonyloxy)naphthalimide.

Specific examples of the disulfonyldiazomethane compound include, but are not limited to, bis(trifluoromethylsulfonyl)diazomethane, bis(cyclohexylsulfonyl)diazomethane, bis (phenylsulfonyl)diazomethane, bis (p-toluenesulfonyl)diazomethane, bis(2,4-dimethylbenzenesulfonyl)diazomethane, and methylsulfonyl-p-toluenesulfonyldiazomethane.

Examples of the photoacid generator (all examples are represented by trade names of commercial products of Midori Kagaku Co., Ltd.) include, but are not limited to, sulfonium salt compounds such as "TPS105" (CAS No. 66003789), "TPS109" (CAS No. 144317442), "MDS105" (CAS No. 116808674), "MDS205" (CAS No. 81416377), "DTS105" (CAS No. 111281120), "NDS105" (CAS No. 195057831), and "NDS165" (CAS No. 316821984); iodonium salt compounds such as "DPI105" (CAS No.

66003767), "DPI106" (CAS No. 214534448), "DPI109" (CAS No. 194999821), "DPI201" (CAS No. 6293669), "BI105" (CAS No. 154557161), "MPI105" (CAS No. 115298630), "MPI106" (CAS No. 260061469), "MPI109" (CAS No. 260061470), "BBI105" (CAS No. 84563542), "BBI106" (CAS No. 185195306), "BBI109" (CAS No. 194999854), "BBI110" (CAS No. 213740808), and "BBI201" (CAS No. 142342334); and compounds having BF$_4$ counter ions such as "NAI106" (naphthalimidecamphorsulfonate salt, CAS No. 83697567), "NAI100" (CAS No. 83697534), "NAI1002" (CAS No. 76656489), "NAI1004" (CAS No. 83697603), "NAI101" (CAS No. 5551724), "NAI105" (CAS No. 85342627), "NAI109" (CAS No. 171417917), "NI101" (CAS No. 131526993), "NI105" (CAS No. 85342638), "NDI101" (CAS No. 141714821), "NDI105" (CAS No. 133710620), "NDI106" (CAS No. 210218578), "NDI109" (CAS No. 307531766), "PAI01" (CAS No. 17512888), "PAI101" (CAS No. 82424531), "PAI106" (CAS No. 202419883), "PAI1001" (CAS No. 193222025), "SI101" (CAS No. 55048390), "SI105" (CAS No. 34684407), "SI106" (CAS No. 179419320), "SI109" (CAS No. 252937669), "PI105" (CAS No. 41580589), "PI106" (CAS No. 83697512), and "DTS200" (CAS No. 203573062).

These photoacid generators may be used singly or in combination of two or more species.

The amount of the acid generator contained in the releasing agent composition cannot unequivocally be determined, since the amount varies depending on, for example, the temperature of heating at film formation and the target debonding performance. However, the amount of the acid generator with respect to the polymer is generally 0.1 to 30 mass %. From the viewpoints of achieving suitable curing and producing, at high reproducibility, a laminate in which the semiconductor substrate can be suitably separated from the support substrate, the amount of the acid generator is preferably 0.5 mass % or more, more preferably 1 mass % or more, still more preferably 5 mass % or more, and is preferably 25 mass % or less, more preferably 20 mass % or less, and still more preferably 15 mass % or less.

The releasing agent composition contains a solvent.

Such a solvent may be, for example, a high-polarity solvent that can suitably dissolve components such as the aforementioned polymer. If necessary, a low-polarity solvent may also be used for the purpose of, for example, adjustment of viscosity or surface tension. In the present invention, the "low-polarity solvent" is defined as a solvent exhibiting a dielectric constant less than 7 at a frequency of 100 kHz, and the "high-polarity solvent" is defined as a solvent exhibiting a dielectric constant of 7 or more at a frequency of 100 kHz. Such solvents may be used singly or in combination of two or more species.

Examples of the High-Polarity Solvent Include amide solvents, such as N,N-dimethylformamide, N,N-dimethylacetamide, N,N-dimethylisobutylamide, N-methylpyrrolidone, and 1,3-dimethyl-2-imidazolidinone;
ketone solvents, such as ethyl methyl ketone, isophorone, and cyclohexanone;
cyano solvents, such as acetonitrile and 3-methoxypropionitrile;
polyhydric alcohol solvents, such as ethylene glycol, diethylene glycol, triethylene glycol, dipropylene glycol, 1,3-butanediol, and 2,3-butanediol;
monohydric alcohol solvents other than aliphatic alcohols, such as propylene glycol monomethyl ether, diethylene glycol monomethyl ether, diethylene glycol momophenyl ether, triethylene glycol monomethyl ether, dipropylene glycol monomethyl ether, benzyl alcohol, 2-phenoxyethanol, 2-benzyloxyethanol, 3-phenoxybenzyl alcohol, and tetrahydrofurfuryl alcohol; and
sulfoxide solvents, such as dimethyl sulfoxide.

Examples of the Low-Polarity Solvent Include chlorine-containing solvents such as chloroform and chlorobenzene;
aromatic hydrocarbon solvents such as alkylbezenes, for example, toluene, xylene, tetraline, cyclohexylbenzene, and decylbenzene;
aliphatic alcohol solvents such as 1-octanol, 1-nonanol, and 1-decanol;
ether solvents such as tetrahydrofuran, dioxane, anisole, 4-methoxytoluene, 3-phenoxytoluene, dibenzyl ether, diethylene glycol dimethyl ether, diethylene glycol butyl methyl ether, triethylene glycol dimethyl ether, and triethylene glycol butyl methyl ether; and ester solvents such as methyl benzoate, ethyl benzoate, butyl benzoate, isoamyl benzoate, bis(2-ethylhexyl) phthalate, dibutyl maleate, dibutyl oxalate, hexyl acetate, propylene glycol monomethyl ether acetate, diethylene glycol monoethyl ether acetate, and diethylene glycol monobutyl ether acetate.

The solvent content of the composition is appropriately modified in consideration of, for example, a desired viscosity of the composition, the application method to be employed, and the thickness of a thin film to be formed. The solvent content is 99 mass % or less with respect to the entire composition, preferably 70 to 99 mass % with respect to the entire composition. That is, the amount of film-forming component(s) is 1 to 30 mass %, with respect to the entire composition. As used herein, the term "film-forming component" refers to a component contained in the composition other the solvent.

The viscosity and surface tension of the releasing agent composition are appropriately adjusted by modifying the type of the solvent(s) used, the compositional proportions of the solvents, and the film-forming component concentration, etc., in consideration of various factors such as the application method to be employed, and a desired film thickness.

In a certain embodiment of the present invention, the releasing agent composition contains a glycol solvent, from the viewpoints of, for example, preparing a composition having high homogeneity at high reproducibility, preparing a composition having high storage stability at high reproducibility, and preparing a composition that forms a highly homogeneous thin film at high reproducibility. As used herein, the term "glycol solvent" collectively refers to glycols, glycol monoethers, glycol diethers, glycol monoesters, glycol diesters, and glycol ester ethers.

An example of a preferred glycol solvent is represented by formula (G).

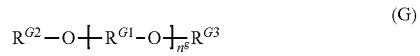

(G)

In formula (G), $R^{G1}$ independently represents a C2 to C4 linear-chain or branched-chain alkylene group; each of $R^{G2}$ and $R^{G3}$ independently represents a hydrogen atom, a linear-chain or branch C1 to C8 alkyl group, or an alkylacyl group wherein the alkyl moiety is a C1 to C8 linear-chain or branched alkyl group; and $n^g$ represents an integer of 1 to 6.

Specific examples of the C2 to C4 linear-chain or branched alkylene group include, but are not limited to, ethylene, trimethylene, 1-methylethylene, tetramethylene, 2-methylpropane-1,3-diyl, pentamethylene, and hexamethylene.

Among them, a C2 or C3 linear-chain or branched alkylene group is preferred, and a C3 linear-chain or branched-chain alkylene group is more preferred, from the viewpoints of, for example, preparing a composition having high homogeneity at high reproducibility, preparing a composition having high storage stability at high reproducibility, and preparing a composition that forms a highly homogeneous film at high reproducibility. Further, a C3 linear-chain or branched alkylene group is more preferred.

Specific examples of the linear-chain or branched C1 to C8 alkyl group include, but are not limited to, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Of these, methyl and ethyl are preferred, with methyl being more preferred, from the viewpoints of providing a highly uniform composition at high reproducibility, providing a composition having high storage stability at high reproducibility, providing a composition which can form a highly uniform film at high reproducibility, etc.

In the alkylacyl group in which the alkyl moiety is a C1 to C8 linear-chain or branched alkyl group, specific examples of the C1 to C8 linear-chain or branched alkyl group are the same as those described above.

In particular, a methylcarbonyl group or an ethylcarbonyl group is preferred, and a methylcarbonyl group is more preferred, from the viewpoints of, for example, preparing a composition having high homogeneity at high reproducibility, preparing a composition having high storage stability at high reproducibility, and preparing a composition that forms a highly homogeneous thin film at high reproducibility.

In formula (G), $n^g$ is preferably 4 or less, more preferably 3 or less, still more preferably 2 or less, most preferably 1, from the viewpoints of, for example, preparing a composition having high homogeneity at high reproducibility, preparing a composition having high storage stability at high reproducibility, and preparing a composition that forms a highly homogeneous thin film at high reproducibility.

From the viewpoints of, for example, producing a composition having high homogeneity at high reproducibility, producing a composition having high storage stability at high reproducibility, and producing a composition that forms a highly homogeneous thin film at high reproducibility, in formula (G), preferably, at least one of $R^{G2}$ and $R^{G3}$ is a linear-chain or branched C1 to C8 alkyl group, and more preferably, one of $R^{G2}$ and $R^{G3}$ is a linear-chain or branched C1 to C8 alkyl group, and the other is a hydrogen atom or an alkylacyl group wherein the alkyl moiety is a C1 to C8 linear-chain or branched alkyl group.

From the viewpoints of, for example, producing a composition having high homogeneity at high reproducibility, producing a composition having high storage stability at high reproducibility, and producing a composition that forms a highly homogeneous thin film at high reproducibility, the amount of the glycol solvent is preferably 50 mass % or more, more preferably 70 mass % or more, still more preferably 80 mass % or more, yet more preferably 90 mass % or more, further more preferably 95 mass % or more, with respect to the entire solvent contained in the releasing agent composition.

In the releasing agent composition, the film-forming components are homogeneously dispersed or dissolved (preferably, dissolved) in the solvent, from the viewpoints of, for example, producing a composition having high homogeneity at high reproducibility, producing a composition having high storage stability at high reproducibility, and producing a composition that forms a highly homogeneous thin film at high reproducibility.

The releasing agent composition may be produced by mixing a polymer, a photoacid generator, and a solvent.

No particular limitation is imposed on the chronological order of mixing of these components. In one non-limitative mode of the method which can easily produce the releasing agent composition at high reproducibility, a polymer and a photoacid generator are dissolved in a solvent at one time. In another non-limitative mode, a portion of a mixture of a polymer and a photoacid generator is dissolved in a solvent, the remaining portion of the mixture is dissolved in another solvent, and the resultant solutions are mixed together. In this case, the reaction mixture obtained in the synthesis of the polymer as is or a concentrate or dilute thereof may also be used. Also, the releasing agent composition may be appropriately heated in the preparation thereof, so long as the components of the composition are not decomposed or denatured.

In the present invention, the solvent, solution, etc. used in relation to the production of the composition may be filtered for the purpose of removing foreign matter by means of, for example, a sub-micrometer filter in the course of producing the composition or after mixing of all the components.

The release layer included in the laminate of the present invention generally has a thickness of 10 nm to 10 m.

The present invention is also directed to the above-described releasing agent composition, and conditions (e.g., suitable conditions or production conditions) in relation to the composition are as described above. The releasing agent composition of the present invention can provide, at high reproducibility, a film suitably serving as a release layer that can be used for the production of, for example, a semiconductor device.

Particularly, the releasing agent composition of the present invention can be suitably used for forming a release layer of a laminate in which two layer are intervened by a semiconductor substrate and a UV-ray-transmissive support substrate, wherein one of the two layers is an adhesive layer, and the other is the release layer. When the release of layer of such a laminate is irradiated with a UV ray from the support substrate side and then subjected to heat treatment, separation or decomposition of the release layer suitably proceeds as described above. As a result, the semiconductor substrate can be separated from the support substrate, without applying an excessive load for debonding.

The adhesive layer included in the laminate of the present invention may be, for example, a film formed from an adhesive composition containing an adhesive component (S).

No particular limitation is imposed on the adhesive component (S), so long as it is used in this type of application.

Examples of the adhesive component (S) include, but are not limited to, a polysiloxane adhesive, an acrylic resin adhesive, an epoxy resin adhesive, a polyamide adhesive, a polystyrene adhesive, a polyimide adhesive, and a phenolic resin adhesive.

Among them, the adhesive component (S) is preferably a polysiloxane adhesive, since the adhesive exhibits suitable bonding property in processing of a wafer, etc., can be suitably peeled after the processing, and exhibits excellent heat resistance.

In one preferred mode, the adhesive composition used in the present invention contains, as an adhesive component, a polyorganosiloxane component (A) which is curable through hydrosilylation. In a more preferred embodiment, the polyorganosiloxane component (A) which is curable through hydrosilylation contains a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T), and a platinum group metal catalyst (A2); wherein the polysiloxane (A1) contains a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T', and a polyorganosiloxane (a2) having one or more units selected from the group consisting of a siloxane unit represented by $SiO_2$ (unit Q"), a siloxane unit represented by $R^1R^2R^{3"}SiO_{1/2}$ (unit M"), a siloxane unit represented by $R^{4"}R^{5"}SiO_{22}$ (unit D"), and a siloxane unit represented by $R^{6"}SiO_{3/2}$ (unit T"), and at least one unit selected from the group consisting of unit M", unit D", and unit T".

Each of $R^1$ to $R^6$ is a group or an atom bonded to a silicon atom and represents an alkyl group, an alkenyl group, or a hydrogen atom.

Each of $R^{1'}$ to $R^{6'}$ is a group bonded to a silicon atom and represents an alkyl group or an alkenyl group, and at least one of $R^{1'}$ to $R^{6'}$ is an alkenyl group.

Each of $R^{1"}$ to $R^{6"}$ is a group or an atom bonded to a silicon atom and represents an alkyl group or a hydrogen atom, and at least one of $R^{1"}$ to $R^{6"}$ is a hydrogen atom.

The alkyl group may be linear-chain, branched-chain, or cyclic. However, a linear-chain or branched-chain alkyl group is preferred. No particular limitation is imposed on the number of carbon atoms thereof, and the number of carbon atoms is generally 1 to 40, preferably 30 or less, more preferably 20 or less, still more preferably 10 or less.

Specific examples of the linear-chain or branched-chain alkyl group include, but are not limited to, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Of these, methyl is preferred.

Specific examples of the cycloalkyl group include, but are not limited to, cycloalkyl groups such as cyclopropyl, cyclobutyl, 1-methyl-cyclopropyl, 2-methyl-cyclopropyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl; and bicycloalkyl groups such as bicyclobutyl, bicyclopentyl, bicyclohexyl, bicycloheptyl, bicyclooctyl, bicyclononyl, and bicyclodecyl.

The alkenyl group may be linear-chain, branched-chain, or cyclic. No particular limitation is imposed on the number of carbon atoms thereof, and the number of carbon atoms is generally 2 to 40, preferably 30 or less, more preferably 20 or less, still more preferably 10 or less.

Specific examples of the alkenyl group include, but are not limited to, ethenyl, 1-propenyl, 2-propenyl, 1-methyl-1-ethenyl, 1-butenyl, 2-butenyl, 3-butenyl, 2-methyl-1-propenyl, 2-methyl-2-propenyl, 1-ethylethenyl, 1-methyl-1-propenyl, 1-methyl-2-propenyl, 1-pentenyl, 2-pentenyl, 3-pentenyl, 4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl-1-propenyl, 1,2-dimethyl-2-propenyl, 1-cyclopentenyl, 2-cyclopentenyl, 3-cyclopentenyl, 1-hexenyl, 2-hexenyl, 3-hexenyl, 4-hexenyl, 5-hexenyl, 1-methyl-1-pentenyl, 1-methyl-2-pentenyl, 1-methyl-3-pentenyl, 1-methyl-4-pentenyl, 1-n-butylethenyl, 2-methyl-1-pentenyl, 2-methyl-2-pentenyl, 2-methyl-3-pentenyl, 2-methyl-4-pentenyl, 2-n-propyl-2-propenyl, 3-methyl-1-pentenyl, 3-methyl-2-pentenyl, 3-methyl-3-pentenyl, 3-methyl-4-pentenyl, 3-ethyl-3-butenyl, 4-methyl-1-pentenyl, 4-methyl-2-pentenyl, 4-methyl-3-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1-methyl-2-ethyl-2-propenyl, 1-s-butylethenyl, 1,3-dimethyl-1-butenyl, 1,3-dimethyl-2-butenyl, 1,3-dimethyl-3-butenyl, 1-i-butylethenyl, 2,2-dimethyl-3-butenyl, 2,3-dimethyl-1-butenyl, 2,3-dimethyl-2-butenyl, 2,3-dimethyl-3-butenyl, 2-i-propyl-2-propenyl, 3,3-dimethyl-1-butenyl, 1-ethyl-1-butenyl, 1-ethyl-2-butenyl, 1-ethyl-3-butenyl, 1-n-propyl-1-propenyl, 1-n-propyl-2-propenyl, 2-ethyl-1-butenyl, 2-ethyl-2-butenyl, 2-ethyl-3-butenyl, 1,1,2-trimethyl-2-propenyl, 1-t-butylethenyl, 1-methyl-1-ethyl-2-propenyl, 1-ethyl-2-methyl-1-propenyl, 1-ethyl-2-methyl-2-propenyl, 1-i-propyl-1-propenyl, 1-i-propyl-2-propenyl, 1-methyl-2-cyclopentenyl, 1-methyl-3-cyclopentenyl, 2-methyl-1-cyclopentenyl, 2-methyl-2-cyclopentenyl, 2-methyl-3-cyclopentenyl, 2-methyl-4-cyclopentenyl, 2-methyl-5-cyclopentenyl, 2-methylene-cyclopentyl, 3-methyl-1-cyclopentenyl, 3-methyl-2-cyclopentenyl, 3-methyl-3-cyclopentenyl, 3-methyl-4-cyclopentenyl, 3-methyl-5-cyclopentenyl, 3-methylene-cyclopentyl, 1-cyclohexenyl, 2-cyclohexenyl, and 3-cyclohexenyl.

Of these, ethenyl and 2-propenyl are preferred.

As described above, the polysiloxane (A1) includes the polyorganosiloxane (a1) and the polyorganosiloxane (a2). In curing, the alkenyl group present in the polyorganosiloxane (a1) and the hydrogen atom (Si—H group) present in the polyorganosiloxane (a2) form a cross-linking structure through hydrosilylation in the presence of the platinum group metal catalyst (A2). As a result, a cured film is yielded.

The polyorganosiloxane (a1) has one or more units selected from the group consisting of unit Q', unit M', unit D', and unit T', and at least one unit selected from the group consisting of unit M', unit D', and unit T'. Two or more polyorganosiloxanes satisfying the above conditions may be used in combination as the polyorganosiloxane (a1).

Examples of preferred combinations of two or more units selected from the group consisting of unit Q', unit M', unit D', and unit T' include, but are not limited to, (unit Q' and unit M'), (unit D' and unit M'), (unit T' and unit M'), and (unit Q', unit T', and unit M').

In the case where the polyorganosiloxane (a1) includes two or more polyorganosiloxanes, examples of preferred combinations include, but are not limited to, (unit Q' and unit M')+(unit D' and unit M'); (unit T' and unit M')+(unit D' and unit M'); and (unit Q', unit T', and unit M')+(unit T' and unit M').

The polyorganosiloxane (a2) has one or more units selected from the group consisting of unit Q", unit M", unit D", and unit T", and at least one unit selected from the group consisting of unit M", unit D", and unit T".

Two or more polyorganosiloxanes satisfying the above conditions may be used in combination as the polyorganosiloxane (a2).

Examples of preferred combinations of two or more units selected from the group consisting of unit Q", unit M", unit D", and unit T"include, but are not limited to, (unit M" and unit D"), (unit Q" and unit M"), and (unit Q", unit T", and unit M").

The polyorganosiloxane (a1) is formed of siloxane units in which an alkyl group and/or an alkenyl group is bonded to a silicon atom. The alkenyl group content of the entire substituents $R^1$ to $R^{6'}$ is preferably 0.1 mol % to 50.0 mol %, more preferably 0.5 mol % to 30.0 mol %, and the remaining $R^{1'}$ to $R^{6'}$ may be alkyl groups.

The polyorganosiloxane (a2) is formed of siloxane units in which an alkyl group and/or a hydrogen atom is bonded to a silicon atom. The hydrogen atom content of the entire substituents or atoms $R^{1"}$ to $R^{6"}$ is preferably 0.1 mol % to 50.0 mol %, more preferably 10.0 mol % to 40.0 mol %, and the remaining $R^{1"}$ to $R^{6"}$ may be alkyl groups.

The polysiloxane (A1) includes the polyorganosiloxane (a1) and the polyorganosiloxane (a2). In one preferred embodiment of the present invention, the ratio by mole of alkenyl groups present in the polyorganosiloxane (a1) to hydrogen atoms forming Si—H bonds present in the polyorganosiloxane (a2) is 1.0:0.5 to 1.0:0.66.

The weight average molecular weight of each of the polyorganosiloxane (a1) and the polyorganosiloxane (a2) is generally 500 to 1,000,000. From the viewpoint of attaining the effects of the present invention at high reproducibility, the weight average molecular weight is preferably 5,000 to 50,000.

Meanwhile, in the present invention, the weight average molecular weight, number average molecular weight, and polydispersity may be determined by means of, for example, a GPC apparatus (EcoSEC, HLC-8320GPC, products of Tosoh Corporation) and GPC columns (TSKgel SuperMultiporeHZ-N and TSKgel SuperMultiporeHZ-H, products of Tosoh Corporation) at a column temperature of 40° C. and a flow rate of 0.35 mL/min by use of tetrahydrofuran as an eluent (extraction solvent) and polystyrene (product of Sigma-Aldrich) as a standard substance.

The viscosity of each of the polyorganosiloxane (a1) and the polyorganosiloxane (a2) is generally 10 to 1,000,000 (mP·s). From the viewpoint of attaining the effects of the present invention at high reproducibility, the viscosity is preferably 50 to 10,000 (mP·s). Notably, in the present invention, the viscosity is measured at 25° C. by means of an E-type rotational viscometer.

The polyorganosiloxane (a1) and the polyorganosiloxane (a2) react with each other via hydrosilylation, to thereby form a film. Thus, the curing mechanism differs from the mechanism of curing mediated by, for example, silanol groups. Therefore, neither of the siloxanes is required to have a silanol group or a functional group forming a silanol group through hydrolysis (e.g., an alkyloxy group).

In one preferred embodiment of the present invention, the adhesive component (S) contains the aforementioned polysiloxane (A1) and the platinum group metal catalyst (A2).

The platinum-based metallic catalyst is used to accelerate hydrosilylation between alkenyl groups of the polyorganosiloxane (a1) and Si—H groups of the polyorganosiloxane (a2).

Specific examples of the platinum-based metallic catalyst include, but are not limited to, platinum catalysts such as platinum black, platinum(II) chloride, chloroplatinic acid, a reaction product of chloroplatinic acid and a monohydric alcohol, a chloroplatinic acid-olefin complex, and platinum bis(acetoacetate).

Examples of the platinum-olefin complex include, but are not limited to, a complex of platinum with divinyltetramethyldisiloxane.

The amount of platinum group metal catalyst (A2) is generally 1.0 to 50.0 ppm, with respect to the total amount of polyorganosiloxane (a1) and polyorganosiloxane (a2).

In order to suppress progress of hydrosilylation, the polyorganosiloxane component (A) may contain a polymerization inhibitor (A3).

No particular limitation is imposed on the polymerization inhibitor, so long as it can suppress the progress of hydrosilylation. Specific examples of the polymerization inhibitor include alkynyl alcohols such as 1-ethynyl-1-cyclohexanol and 1,1-diphenyl-2-propyn-1-ol.

Generally, the amount of polymerization inhibitor with respect to the total amount of the polyorganosiloxane (a1) and the polyorganosiloxane (a2) is 1,000.0 ppm or more from the viewpoint of attaining the effect, and 10,000.0 ppm or less from the viewpoint of preventing excessive suppression of hydrosilylation.

The adhesive composition used in the present invention may contain a releasing agent component (B). Through incorporation of the releasing agent component (B) into the adhesive composition used in the present invention, the adhesive layer formed therefrom can be suitably peeled at high reproducibility.

A typical example of the releasing agent component (B) is a polyorganosiloxane. Specific examples of the polyorganosiloxane include, but are not limited to, an epoxy-group-containing polyorganosiloxane, a methyl-group-containing polyorganosiloxane, and a phenyl-group-containing polyorganosiloxane.

Examples of preferred polyorganosiloxanes (i.e., release agent component (B)) include, but are not limited to, an epoxy-group-containing polyorganosiloxane, a methyl-group-containing polyorganosiloxane, and a phenyl-group-containing polyorganosiloxane.

The polyorganosiloxane serving as the releasing agent component (B) generally has a weight average molecular weight of 100,000 to 2,000,000. The weight average molecular weight is preferably 200,000 to 1,200,000, more preferably 300,000 to 900,000, from the viewpoint of attaining the effects of the present invention at high reproducibility. The polyorganosiloxane generally has a polydispersity of 1.0 to 10.0. The polydispersity is preferably 1.5 to 5.0, more preferably 2.0 to 3.0, from the viewpoint of attaining suitable debonding at high reproducibility. Notably, the weight average molecular weight and the polydispersity may be measured through the aforementioned methods in relation to polysiloxane.

The polyorganosiloxane serving as the releasing agent component (B) generally has a viscosity of 1,000 to 2,000,000 mm²/s. This viscosity of the polyorganosiloxane is a kinematic viscosity (unit: cSt=mm²/s), which may be calculated by dividing viscosity (mPa·s) by density (g/cm³) Specifically, the value of kinematic viscosity may be obtained from the viscosity as measured at 25° C. by means of an E-type rotary viscometer and the density and calculated by the equation: kinematic viscosity (mm²/s)=viscosity (mPa·s)/density (g/cm³).

The epoxy-group-containing polyorganosiloxane includes such a siloxane containing a siloxane unit represented by, for example, $R^{11}R^{12}SiO_{2/2}$(unit $D^{10}$)

$R^{11}$ is a group bonded to a silicon atom and represents an alkyl group, and $R^{12}$ is a group bonded to a silicon atom and represents an epoxy group or an organic group containing an epoxy group. Specific examples of the alkyl group include those as exemplified above.

The epoxy group in the organic group containing an epoxy group may be an independent epoxy group which does not condense with another ring structure, or may be an epoxy group forming a condensed ring with another ring structure (e.g., a 1,2-epoxycyclohexyl group).

Specific examples of the organic group containing an epoxy group include, but are not limited to, 3-glycidoxy-propyl and 2-(3,4-epoxycyclohexyl)ethyl.

In the present invention, examples of preferred epoxy-group-containing polyorganosiloxanes include, but are not limited to, epoxy-group-containing polydimethylsiloxane.

The epoxy-group-containing polyorganosiloxane contains the aforementioned siloxane unit (unit $D^{10}$), but may also contain the aforementioned unit Q, unit M and/or unit T, in addition to unit $D^{10}$.

In one preferred embodiment of the present invention, specific examples of the epoxy-group-containing polyorganosiloxane include polyorganosiloxane formed only of unit $D^{10}$, polyorganosiloxane formed of unit $D^{10}$ and unit Q, polyorganosiloxane formed of unit $D^{10}$ and unit M, polyorganosiloxane formed of unit $D^{10}$ and unit T, polyorganosiloxane formed of unit $D^{10}$, unit Q, and unit M, polyorganosiloxane formed of unit $D^{10}$, unit M, and unit T, and polyorganosiloxane formed of unit $D^{10}$, unit Q, unit M, and unit T.

The epoxy-group-containing polyorganosiloxane is preferably an epoxy-group-containing polydimethylsiloxane having an epoxy value of 0.1 to 5. The weight average molecular weight thereof is generally 1,500 to 500,000, but preferably 100,000 or lower, for the purpose of suppression of precipitation in the adhesive.

Specific examples of the epoxy-group-containing polyorganosiloxane include, but are not limited to, those represented by formulas (E1) to (E3):

[F8]

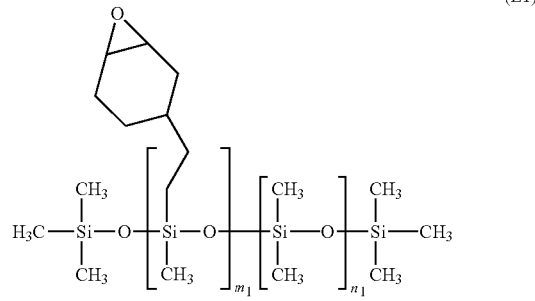

(wherein each of $m_1$ and $n_1$ represents the number of repeating units and is a positive integer);

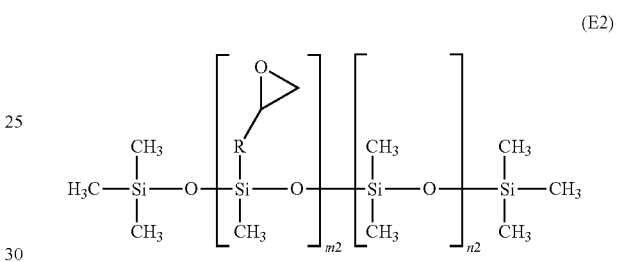

(wherein each of $m_2$ and $n_2$ represents the number of repeating units and is a positive integer, and R represents a C1 to C10 alkylene group); and

[F10]

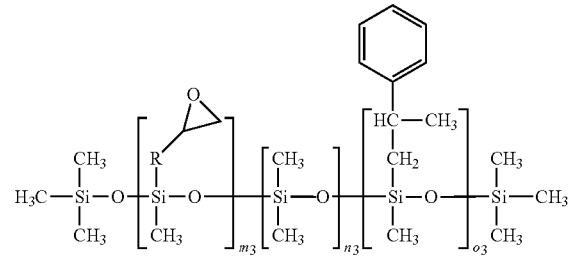

(wherein each of $m_3$, $n_3$ and $O_3$ represents the number of repeating units and is a positive integer, and R represents a C1 to C10 alkylene group).

The methyl-group-containing polyorganosiloxane includes, for example, a siloxane containing a siloxane unit represented by $R^{210}R^{220}SiO_{2/2}$ (unit $D^{200}$), preferably a siloxane containing a siloxane unit represented by $R^{21}R^{21}SiO_{2/2}$ (unit $D^2 0$).

Each of $R^{210}$ and $R^{220}$ is a group bonded to a silicon atom and represents an alkyl group. At least one of $R^{210}$ and $R^{220}$ is a methyl group. Specific examples of the alkyl group include those as exemplified above.

$R^{21}$ is a group bonded to a silicon atom and represents an alkyl group. Specific examples of the alkyl group include those as exemplified above. $R^{21}$ is preferably a methyl group.

In the present invention, examples of preferred methyl-group-containing polyorganosiloxanes include, but are not limited to, polydimethylsiloxane.

The methyl-group-containing polyorganosiloxane contains the aforementioned siloxane unit (unit $D^{200}$ or unit $D^{20}$), but may also contain the aforementioned unit Q, unit M and/or unit T, in addition to unit $D^{200}$ or unit $D^{20}$.

In one embodiment of the present invention, specific examples of the methyl-group-containing polyorganosiloxane include polyorganosiloxane formed only of unit $D^{200}$, polyorganosiloxane formed of unit $D^{200}$ and unit Q, polyorganosiloxane formed of unit $D^{200}$ and unit M, polyorganosiloxane formed of unit $D^{200}$ and unit T, polyorganosiloxane formed of unit $D^{200}$, unit Q, and unit M, polyorganosiloxane formed of unit $D^{200}$, unit M, and unit T, and polyorganosiloxane formed of unit $D^{200}$, unit Q, unit M, and unit T.

In one preferred embodiment of the present invention, specific examples of the methyl-group-containing polyorganosiloxane include polyorganosiloxane formed only of unit $D^{20}$, polyorganosiloxane formed of unit $D^{20}$ and unit Q, polyorganosiloxane formed of unit $D^{20}$ and unit M, polyorganosiloxane formed of unit $D^{20}$ and unit T, polyorganosiloxane formed of unit $D^{20}$, unit Q, and unit M, polyorganosiloxane formed of unit $D^{20}$, unit M, and unit T, and polyorganosiloxane formed of unit $D^{20}$, unit Q, unit M, and unit T.

Specific examples of the methyl-group-containing polyorganosiloxane include, but are not limited to, a polyorganosiloxane represented by formula (M1):

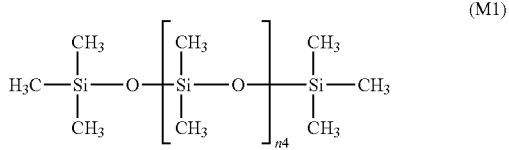

(M1)

(wherein $n_4$ represents the number of repeating units and is a positive integer).

Examples of the phenyl-group-containing polyorganosiloxane include a siloxane containing a siloxane unit represented by $R^{31}R^{32}SiO_{2/2}$(unit $D^{30}$)

$R^{31}$ is a group bonded to a silicon atom and represents a phenyl group or an alkyl group, and $R^{32}$ is a group bonded to a silicon atom and represents a phenyl group. Specific examples of the alkyl group include those as exemplified above. $R^{31}$ is preferably a methyl group.

The phenyl-group-containing polyorganosiloxane contains the aforementioned siloxane unit (unit $D^{30}$), but may also contain the aforementioned unit Q, unit M and/or unit T, in addition to unit $D^{30}$.

In one preferred embodiment of the present invention, specific examples of the phenyl-group-containing polyorganosiloxane include polyorganosiloxane formed only of unit $D^{30}$, polyorganosiloxane formed of unit $D^{30}$ and unit Q, polyorganosiloxane formed of unit $D^{30}$ and unit M, polyorganosiloxane formed of unit $D^{30}$ and unit T, polyorganosiloxane formed of unit $D^{30}$, unit Q, and unit M, polyorganosiloxane formed of unit $D^{30}$, unit M, and unit T, and polyorganosiloxane formed of unit $D^{30}$, unit Q, unit M, and unit T.

Specific examples of the phenyl-group-containing polyorganosiloxane include, but are not limited to, a polyorganosiloxane represented by formula (P1) or (P2):

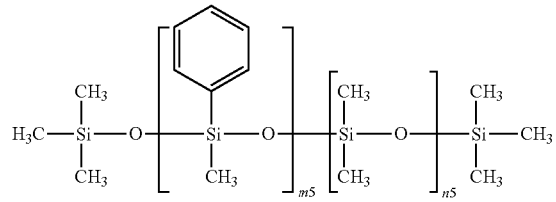

(P1)

(wherein each of $m_5$ and $n_5$ represents the number of repeating units and is a positive integer); or

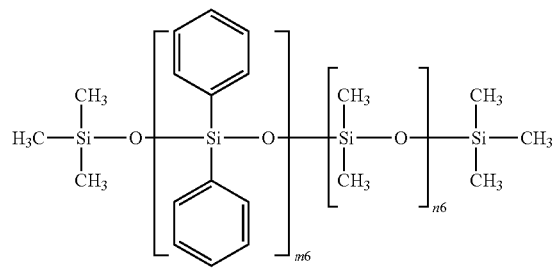

(P2)

(wherein each of $m_6$ and $n_6$ represents the number of repeating units and is a positive integer).

In one preferred mode, the adhesive composition used in the present invention contains the polyorganosiloxane component (A) which is curable through hydrosilylation and the releasing agent component (B). In a preferred mode, the adhesive composition contains a polyorganosiloxane as the releasing agent component (B).

The adhesive composition used in the present invention may contain the adhesive component (S) and the releasing agent component (B) at any ratio. In consideration of the balance between adhesiveness and peelability, the ratio by mass of component (S) to component (B) is preferably 99.995:0.005 to 30:70, more preferably 99.9:0.1 to 75:25.

In other words, when the adhesive composition contains the polyorganosiloxane component (A) which is curable through hydrosilylation, the ratio by mass of component (A) to component (B) is preferably 99.995:0.005 to 30:70, more preferably 99.9:0.1 to 75:25.

For the purpose of adjusting the viscosity or for other reasons, the adhesive composition used in the present invention may contain a solvent. Specific examples of the solvent include, but are not limited to, an aliphatic hydrocarbon, an aromatic hydrocarbon, and a ketone.

More specific examples of the solvent include, but are not limited to, hexane, heptane, octane, nonane, decane, undecane, dodecane, isododecane, menthane, limonene, toluene, xylene, mesitylene, cumene, MIBK (methyl isobutyl ketone), butyl acetate, diisobutyl ketone, 2-octanone, 2-nonanone, and 5-nonanone. These solvents may be used singly or in combination of two or more species.

In the case where the adhesive composition used in the present invention contains a solvent, the solvent content is appropriately adjusted in consideration of a target viscosity of the composition, the application method to be employed, the thickness of the formed thin film, etc. The solvent content of the entire adhesive composition is generally about 10 to about 90 mass %.

The viscosity (25° C.) of the adhesive composition used in the present invention is generally 500 to 20,000 mPa·s, preferably 1,000 to 5,000 mPa·s. In consideration of various factors such as the application method to be employed and the thickness of the formed thin film, the viscosity of the adhesive composition of the present invention may be adjusted by modifying the type and composition of the organic solvent employed, the film-forming component concentration, etc.

The adhesive composition used in the present invention may be produced by mixing the adhesive component (S) and a solvent with the releasing agent component (B) which is optionally used.

No particular limitation is imposed on the sequential order of mixing, so long as the adhesive composition can be easily produced at high reproducibility. One possible example of the production method includes dissolving the adhesive component (S) and the releasing agent component (B) in a solvent. Another possible example of the production method includes dissolving a part of the adhesive component (S) and the releasing agent component (B) in a solvent, dissolving the remaining components in another solvent, and mixing the two thus-obtained solutions. However, the production method is not limited to the above examples. Notably, so long as the relevant components are not decomposed or denatured in preparation of the adhesive composition, the mixture may be appropriately heated.

In the present invention, in order to remove foreign substances present in the adhesive composition, the composition may be filtered through a sub-micrometer filter or the like in the course of production of the composition or after mixing all the components.

The adhesive layer included in the laminate of the present invention generally has a thickness of 5 to 500 m. From the viewpoint of securing film strength, the thickness is preferably 10 μm or more, more preferably 20 μm or more, still more preferably 30 μm or more. From the viewpoint of avoiding inhomogeneity due to a large film thickness, the thickness is preferably 200 μm or less, more preferably 150 m or less, still more preferably 120 μm or less, much more preferably 70 μm or less.

The laminate of the present invention can be produced by, for example, a method including a first step of applying the adhesive composition onto a surface of a semiconductor substrate, and heating the composition, to thereby form an adhesive coating layer; a second step of applying the releasing agent composition onto a surface of a support substrate and, if required, optionally heating the composition, to thereby form a releasing agent coating layer; and a third step of bringing the adhesive coating layer of the semiconductor substrate into close contact with the releasing agent coating layer of the support substrate under application of a load in a thickness direction of the semiconductor substrate and the support substrate, while performing at least one of heat treatment and reduced pressure treatment, followed by performing post-heat treatment, to thereby produce a laminate.

Alternatively, the laminate of the present invention can be produced by, for example, a method including a first step of applying the releasing agent composition onto a surface of a semiconductor substrate, and heating the composition, to thereby form a releasing agent coating layer; a second step of applying the adhesive composition onto a surface of a support substrate and, if required, optionally heating the composition, to thereby form an adhesive coating layer; and a third step of bringing the releasing agent coating layer of the semiconductor substrate into close contact with the adhesive coating layer of the support substrate under application of a load in a thickness direction of the semiconductor substrate and the support substrate, while performing at least one of heat treatment and reduced pressure treatment, followed by performing post-heat treatment, to thereby produce a laminate.

Notably, so long as the effects of the present invention are not impaired, the respective compositions may be sequentially applied to and heated on either of the substrates.

No particular limitation is imposed on the application method, and spin coating is generally performed. In an alternative method, a coating film is formed through spin coating or a similar technique, and the sheet-form coating film is attached. The concepts of the application method and the coating film of the invention also encompass the alternative method and coating film.

The temperature of heating the applied adhesive composition cannot unequivocally be determined, since the temperature varies depending on, for example, the type or amount of the adhesive component contained in the adhesive composition, the presence or absence of a solvent in the composition, the boiling point of the solvent used, or the desired thickness of the adhesive layer. However, the heating temperature is generally 80° C. to 150° C., and the heating time is generally 30 seconds to 5 minutes.

When the adhesive composition contains a solvent, the applied adhesive composition is usually heated.

The temperature of heating the applied releasing agent composition cannot unequivocally be determined, since the temperature varies depending on, for example, the type or amount of the acid generator, the boiling point of the solvent used, the desired thickness of the release layer. However, the temperature is 80° C. or higher from the viewpoint of forming a suitable release layer at high reproducibility, and the temperature is 300° C. or lower from the viewpoint of suppressing decomposition the acid generator. The heating time is appropriately determined in response to the heating temperature and is generally 10 seconds to 10 minutes.

The heating may be performed by means of a hot plate, an oven, or the like.

The adhesive coating layer formed through application and heating of the adhesive composition generally has a thickness of about 5 to about 500 μm. The thickness is appropriately determined so that the thickness of the adhesive layer finally falls within the aforementioned range.

The releasing agent coating layer formed through application and heating of the releasing agent composition generally has a thickness of about 10 nm to about 10 μm. The thickness is appropriately determined so that the thickness of the release layer finally falls within the aforementioned range.

The laminate of the present invention can be produced by bringing these coating layers into contact with each other, and closely binding these two layers under application of a load in a thickness direction of the semiconductor substrate and the support substrate while performing heat treatment or reduced pressure treatment or both of these treatments, followed by post-heat treatment. The choice of the heat treatment, the reduced pressure treatment, or both of these treatments in combination is appropriately determined in consideration of various factors, including the type of the adhesive composition, the specific composition of the releasing agent composition, the compatibility between films formed from these compositions, the film thickness, and the bonding strength required.

Generally, the heat treatment is performed at a temperature appropriately selected from a range of 20 to 150° C., from the viewpoints of, for example, softening the adhesive coating layer to achieve suitable bonding between the adhesive coating layer and the releasing agent coating layer, and suppressing decomposition of a photoacid generator to produce a suitable releasing agent coating layer at high reproducibility. Particularly, the heat treatment is preferably performed at 130° C. or lower, more preferably at 90° C. or lower, from the viewpoint of suppressing or avoiding excessive curing or undesired denaturation of the adhesive component (S). The heating time is generally 30 seconds or longer, preferably 1 minute or longer, from the viewpoint of securing the adhesive performance, and is generally 10 minutes or shorter, preferably 5 minutes or shorter, from the viewpoint of suppressing denaturation of the adhesive layer or another member.

In the reduced pressure treatment, the adhesive coating layer and the releasing agent coating layer, being in contact with each other, are placed in an atmosphere at 10 Pa to 10,000 Pa. The time of the reduced pressure treatment is generally 1 to 30 minutes.

From the viewpoint of producing, at high reproducibility, a laminate whose substrate can be suitably removed, two adjacent layers, being in contact with each other, are bonded together preferably through reduced-pressure treatment, more preferably through heat treatment in combination of reduced-pressure treatment.

No particular limitation is imposed on the load which is applied to the semiconductor substrate and the support substrate in a thickness direction, so long as the load cause no adverse effects on the semiconductor substrate, the support substrate, and the two layers disposed therebetween, and these elements are closely bound. The load is generally 10 to 1,000 N.

The temperature of post-heating is preferably 120° C. or higher from the viewpoint of, for example, attaining sufficient curing rate, and preferably 260° C. or lower from the viewpoint of, for example, preventing deterioration of the substrates and other component layers.

The heating time is generally 1 minute or longer, preferably 5 minutes or longer, from the viewpoint of achieving suitable joining of the substrates and layers forming the laminate. Also, the heating time is generally 180 minutes or shorter, preferably 120 minutes or shorter, from the viewpoint of preventing or avoiding, for example, an adverse effect on the component layers due to excessive heating.

Heating may be performed by means of a hot plate, an oven, or the like. In the case where the post-heating is performed by means of a hot plate, the laminate may be placed so that either the semiconductor substrate or the support substrate thereof is located at a lower position. However, from the viewpoint of achieving suitable debonding at high reproducibility, the semiconductor substrate is preferably located at a lower position.

Notably, one purpose of performing post-heating is to more suitably form a self-standing film from the adhesive component (S), particularly to attain more suitable curing of the adhesive component (S) via hydrosilylation.

The processed semiconductor substrate production method of the present invention includes a first step of processing a semiconductor substrate of a laminate having the semiconductor substrate, a UV-ray-transmissive support substrate, and an adhesive layer and a release layer disposed between the semiconductor substrate and the support substrate, wherein the release layer is a film formed from a releasing agent composition containing a polymer of an ethylenic unsaturated monomer having a tert-butoxycarbonyl group, a photoacid generator, and a solvent; after the first step, a second step of irradiating the release layer with a UV ray from the support substrate side; and after the second step, a third step of heating the release layer.

In the first step, the processing performed with respect to the semiconductor substrate is, for example, processing of a back surface of a wafer (i.e., the surface opposite the circuit-furnished surface of the wafer), and typical examples of the processing include thinning a wafer by polishing (grinding) the backside thereof. Thereafter, the thinned wafer is provided with through silicon vias (TSVs) and the like and then removed from the support substrate. A plurality of such wafers are stacked to form a wafer laminate, to thereby complete 3-dimensional mounting. Before or after the above process, a backside electrode and the like are formed on the wafer. When thinning of a wafer and the TSV process are performed, a thermal load of 250 to 350° C. is unavoidably applied to the laminate bonded to the support substrate. The laminate of the present invention including the adhesive layer and the release layer has heat resistance to the load.

Notably, the processing is not limited to the aforementioned process and may include, for example, a semiconductor element-mounting process of a substrate onto which the semiconductor element is mounted, wherein the substrate has been temporarily bonded to a support substrate for being supported by the support substrate.

In the second step, the UV radiation to the release layer is not necessarily performed to the entire area of the release layer. Even when the release layer has both a UV ray-irradiated area and a UV ray-non-irradiated area, it is acceptable that the debonding performance of the entire release layer is satisfactorily enhanced after post-heat treatment. Under such conditions, the semiconductor substrate can be easily separated from the support substrate by, for example, pulling the support substrate through application of small external force thereto.

The ratio of the UV ray-irradiated area to the UV ray-non-irradiated area, and the locational distribution of the two areas vary depending on the type and specific composition of the adhesive composition employed, the thickness of the adhesive layer, the thickness of the release layer, the intensity of UV ray irradiation, and other factors. However, those skilled in the art can set appropriate conditions, without carrying out excessive tests.

The irradiation dose of the UV ray is generally 100 to 1,500 mJ/cm$^2$. The irradiation time is appropriately determined in accordance with the wavelength and dose of the UV ray.

UV radiation may be performed through laser light by means of a light source such as a UV lamp.

In the third step, the heating conditions applied to the release layer cannot unequivocally be determined, since the conditions are appropriately determined depending on, for example, the thickness of the release layer, the type or amount of the acid generator, and the dose of the radiated UV ray. Generally, the heating temperature is 50 to 200° C. and the heating time is 1 second to 30 minutes. One conceivable reason for achieving suitable debonding by heating the UV-irradiated release layer is as follows. By promoting diffusion of an acid generated by the photoacid generator, generation of gas from the polymer is activated. As a result, decomposition of the release layer is promoted. Alternatively, when the volume of the gas generated by the polymer is expanded, the decomposition of the release layer is promoted.

Heating may be performed by means of an oven or a hot plate. So long as the release layer is appropriately heated, the laminate may be heated only from one substrate side. For example, the laminate may be heated by means of a hot plate so that the semiconductor substrate thereof is located at a lower position.

In the present invention, more suitable debonding can be realized through performing UV irradiation in combination with post-heat treatment. Such suitable debonding cannot be attained through sole UV irradiation, sole heating, or heating in combination of post UV irradiation.

Also, since the present invention employs a UV ray for conducting debonding, there can be employed non-laser light from a general-purpose lamp as a light source. As a result, damage of a semiconductor substrate (e.g., a silicon wafer), which would otherwise be caused by laser light of high energy, can be avoided. In addition, since non-laser light is employed, the time of light irradiation of one laminate can be shortened, as compared with the case where laser light is employed. Therefore, improvement in throughput is expected.

In the processed semiconductor substrate production method of the present invention, an additional fourth step of cleaning the processed semiconductor substrate in a separated state is generally conducted after the third step.

The peeling interface provided in the laminate varies depending on the layer configuration including the substrates of the laminate. Thus, after the third step, there are cases of, for example, presence of both the adhesive layer and the release layer on the processed semiconductor substrate, and presence of only the release layer on the processed semiconductor substrate. Although the target substances to be removed present on the processed semiconductor substrate vary depending on the above cases, they are removed by use of a remover tape, an organic solvent, a cleaner containing ammonium fluoride salt, or the like, to thereby clean the surface of the semiconductor substrate.

The aforementioned technical and methodological elements involved in the processed semiconductor substrate production method of the present invention may be modified in various manners, so long as the modification does not deviate from the gist of the present invention.

Needless to say, the processed semiconductor substrate production method of the present invention may further include an additional step other than the aforementioned steps.

In the debonding method of the present invention, the release layer of the laminate of the present invention is irradiated with light from the support substrate side, and the release layer is heated, whereby the semiconductor substrate of the laminate is separated from the support substrate thereof.

In the laminate of the present invention, the semiconductor substrate and the UV-ray-transmissive support substrate are preliminarily bonded in a favorably peelable manner by the mediation of the adhesive layer and the release layer. Thus, by irradiating the release layer of the laminate with a UV ray from the support substrate side, and conducting post-heat treatment, the semiconductor substrate can be readily separated from the support substrate. Generally, such debonding is performed after completion of processing of the semiconductor substrate.

EXAMPLES

The present invention will next be described in more detail by way of examples, which should not be construed as limiting the invention thereto. The apparatuses employed in the Examples are as follows.

[Apparatus]
(1) Bonding apparatus: Manual Bonder (product of Suss MicroTec)
(2) UV curing system: UVI-MA (product of Ohmiya Ind. Co., Ltd.)

[Determination of Molecular Weight of Polymer]
(1) The molecular weight of poly(tert-butyl acrylate) was determined under the following conditions.
Apparatus: HLC-8320GPC (product of Tosoh Corporation)
GPC column: (TSKgel Super-MultiporeHZ-N(2 columns), product of Tosoh Corporation)
Column temperature: 40° C.
Flow rate: 0.35 mL/min
Eluent: tetrahydrofuran
Standard sample: polystyrene (product of Showa Denko K.K.)

[1] Preparation of Adhesive Composition

Preparation Example 1

To a 600-mL container dedicated for an agitator, there were added an MQ resin having a polysiloxane structure and vinyl groups (product of WACKER Chemie AG) (80 g), SiH-group-containing linear-chain polydimethylsiloxane (viscosity: 100 mPa·s) (product of WACKER Chemie AG) (2.52 g), SiH-group-containing linear-chain polydimethylsiloxane (viscosity: 70 mPa·s) (product of WACKER Chemie AG) (5.89 g), and 1-ethynyl-1-cyclohexanol (product of WACKER Chemie AG) (0.22 g). The obtained mixture was agitated by means of the agitator for 5 minutes.

Separately, a platinum catalyst (product of WACKER Chemie AG) (0.147 g) and vinyl-group-containing linear-chain polydimethylsiloxane (viscosity: 1,000 mPa·s) (product of WACKER Chemie AG) (5.81 g) were added, and the resultant mixture were agitated by means of an agitator for 5 minutes, and a portion (3.96 g) of the mixture was added to the above mixture. The thus-combined mixture was agitated by means of an agitator for 5 minutes.

Finally, the resultant mixture was filtered through a nylon filter (300 mesh), to thereby prepare an adhesive composition.

[2] Preparation of Composition Containing Acrylate Polymer

Preparation Example 2 tert-Butyl acrylate (30.0 g) serving as a monomer, 2,2'-azobisisobutyronitrile (0.75 g) serving as a radical polymerization initiator, and propylene glycol monomethyl ether acetate (71.75 g) serving as a solvent were added to a flask, and the mixture was agitated. The thus-obtained mixture was heated overnight at 60° C., to thereby allow polymerization to proceed.

The reaction mixture was cooled to room temperature, to thereby yield a composition containing a target tert-butyl acrylate polymer (Mw=45,565, Mw/Mn=5.83).

[3] Preparation of Releasing Agent Composition

Preparation Example 3-1

The composition obtained in Preparation Example 2 was mixed with propylene glycol monomethyl ether acetate, to thereby prepare a solution having a final tert-butyl acrylate polymer concentration to 32 mass %.

To the prepared solution (5.042 g), DTS-105 (product of Midori Kagaku Co., Ltd.) (0.164 g) serving as a photoacid generator and propylene glycol monomethyl ether acetate (3.429 g) were added, and the mixture was agitated, to thereby yield a releasing agent composition.

Preparation Examples 3-2 to 3-4

The procedure of Preparation Example 3-1 was repeated, except that the amounts of the solution, the photoacid generator, and propylene glycol monomethyl ether acetate were changed to 5.116 g, 0.108 g, 3.476 g (Preparation Example 3-2); 5.124 g, 0.176 g, and 6.959 g (Preparation Example 3-3), and 5.131 g, 0.210 g, and 7.050 g (Preparation Example 3-4), respectively, to thereby yield corresponding releasing agent compositions.

[4] Production of laminate

Production Example 1-1

The releasing agent composition obtained in Preparation Example 3-1 was applied onto a 100-mm glass wafer through spin coating, so that the thickness of the releasing agent layer of the finally produced laminate was adjusted to about 2.0 µm. The coating layer was heated at 200° C. for 1 minute, to thereby form a releasing agent coating layer on the glass wafer serving as a support substrate.

Separately, the adhesive composition obtained in Preparation Example 1 was applied onto a 100-mm silicon wafer through spin coating, so that the thickness of the adhesive layer of the finally produced laminate was adjusted to about 60 µm, to thereby form an adhesive coating layer on the silicon wafer serving as a semiconductor substrate.

Subsequently, the glass wafer and the silicon wafer produced above were bonded by means of a bonder, so that the releasing agent coating layer and the adhesive coating layer were sandwiched by the two wafers. The product was subjected a post-heat treatment at 200° C. for 10 minutes, to thereby yield a laminate. Notably, bonding was performed at 23° C. and a reduced pressure of 1,500 Pa. A required number of such laminates were fabricated.

Production Examples 1-2 to 1-4

The procedure of Production Example 1-1 was repeated, except that the releasing agent compositions produced in Preparation Example 3-2 to 3-4 were used instead of the releasing agent composition produced in Preparation Example 3-1, to thereby produce corresponding laminates.

Production Example 2-1

The adhesive composition obtained in Preparation Example 1 was applied onto a 100-mm glass wafer through spin coating, so that the thickness of the adhesive layer of the finally produced laminate was adjusted to about 60 µm, to thereby form an adhesive coating layer on the glass wafer serving as a support substrate.

Separately, the releasing agent composition obtained in Preparation Example 3-1 was applied onto a 100-mm silicon wafer through spin coating, so that the thickness of the releasing agent coating layer of the finally produced laminate was adjusted to about 2.0 µm, and the coating layer was heated at 200° C. for 1 minute, to thereby form a releasing agent coating layer on the silicon wafer serving as a semiconductor substrate.

Subsequently, the glass wafer and the silicon wafer produced above were bonded by means of a bonder, so that the adhesive coating layer and the releasing agent coating layer were sandwiched by the two wafers. The product was subjected a post-heat treatment at 200° C. for 10 minutes, to thereby yield a laminate. Notably, bonding was performed at 23° C. and a reduced pressure of 1,500 Pa. A required number of such laminates were fabricated.

Comparative Production Example 1-1

The releasing agent composition obtained in Preparation Example 3-1 was applied onto a 100-mm glass wafer through spin coating, so that the thickness of the releasing agent layer of the finally produced laminate was adjusted to about 2.0 µm, to thereby form a releasing agent coating layer on the glass wafer serving as a support substrate.

Subsequently, the glass wafer and the 100-mm silicon wafer produced above were bonded by means of a bonder, so that the releasing agent coating layer was sandwiched by the two wafers. The product was subjected a post-heat treatment at 200° C. for 1 minute, to thereby yield a laminate. Notably, bonding was performed at 23° C. and a reduced pressure of 1,500 Pa.

Through visual observation of the produced laminate, a large number of voids were found. Thus, suitable bonding was not confirmed.

[5] Determination of optimal irradiation dose of UV light (365 nm)

The entire surface of the release layer of the laminate produced in Production Example 1-1 was irradiated with UV light from the glass wafer side by means of the UV irradiation apparatus. The minimum UV output required for occurrence of debonding was investigated within an output range of 100 to 1,000 mJ/cm$^2$. The determined value was employed as an optimal irradiation dose. As a result, the optimal irradiation dose was found to be 500 mJ/cm$^2$.

[6] Checking of debonding property by UV light (365 nm)
(Checking of debonding through entire-surface irradiation)

Example 1-1

The entire surface of the release layer of the laminate produced in Production Example 1-1 was irradiated with UV light from the glass wafer side by means of the UV irradiation apparatus. The laminate was heated by means of a hot plate at 200° C. for about 5 seconds, while the silicon wafer of the laminate was located to face the plate. Then, whether or not the glass wafer was removed was checked. The UV output was adjusted to 500 mJ/cm$^2$.

By virtue of UV irradiation, the glass wafer (on the carrier side) was found to be readily removed manually under application of substantially no force.

Comparative Example 1-1

The laminate produced in Production Example 1-1 was heated by means of a hot plate at 200° C. for about 1 minute, while the silicon wafer of the laminate was located to face the plate. Subsequently, the entire surface of the release layer of the laminate was irradiated with UV light from the glass wafer side by means of the UV irradiation apparatus. Then, whether or not the glass wafer was removed was checked. The UV output was adjusted to 500 mJ/cm$^2$.

In the experiment, difficulty was encountered in manually removing the glass wafer (on the carrier side) even under application of force.

Comparative Example 1-2

The laminate produced in Production Example 1-1 was heated by means of a hot plate at 200° C. for about 30 minutes, while the silicon wafer of the laminate was located to face the plate. Then, whether or not the glass wafer was removed was checked.

In the experiment, difficulty was encountered in manually removing the glass wafer (on the carrier side) even under application of force.

Example 2-1

The entire surface of the release layer of the laminate produced in Production Example 2-1 was irradiated with UV light from the glass wafer side by means of the UV irradiation apparatus. The laminate was heated by means of a hot plate at 200° C. for about 10 seconds, while the silicon wafer of the laminate was located to face the plate. Then, whether or not the glass wafer was removed was checked. The UV output was adjusted to 330 mJ/cm².

By virtue of UV irradiation, the glass wafer (on the carrier side) was found to be readily removed manually under application of substantially no force.

Comparative Example 2-1

The entire surface of the release layer of the laminate produced in Production Example 2-1 was irradiated with UV light from the glass wafer side by means of the UV irradiation apparatus. Then, whether or not the glass wafer was removed was checked. The UV output was adjusted to ≤500 mJ/cm².

In the experiment, difficulty was encountered in manually removing the glass wafer (on the carrier side) even under application of force.

The invention claimed is:

1. A laminate comprising
a semiconductor substrate,
a UV-ray-transmissive support substrate, and
an adhesive layer and a release layer disposed between the semiconductor substrate and the support substrate, wherein
the release layer is a film formed from a releasing agent composition containing a polymer of an ethylenic unsaturated monomer having a tert-butoxycarbonyl group, a photoacid generator, and a solvent.

2. The laminate according to claim 1, wherein the ethylenic unsaturated monomer having a tert-butoxycarbonyl group includes at least one species selected from the group consisting of formulas (T1) to (T3):

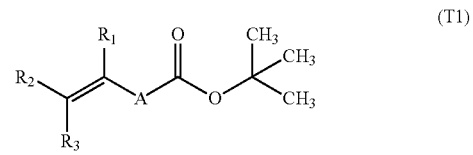
(T1)

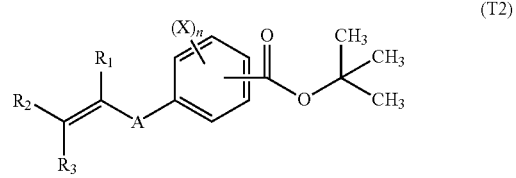
(T2)

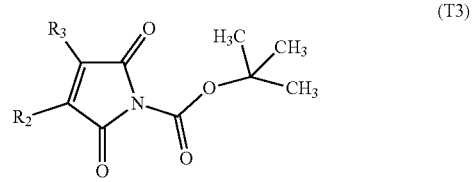
(T3)

(wherein $R_1$ independently represents a hydrogen atom, a cyano group, a methyl group, an ethyl group, an n-propyl group, or an isopropyl group;
each of $R_2$ and $R_3$ independently represents a hydrogen atom or a C1 to C10 alkyl group;
A independently represents a single bond, an ether group (—O—), a carbonyl group (—CO—), an amido group (—CONH—), a C1 to C12 alkylene group, a C6 to C16 arylene group, or a C3 to C12 heteroarylene group;
X independently represents a halogen atom, a cyano group, a nitro group, a C1 to C10 alkyl group, or a C1 to C10 haloalkyl group; and
n is the number of a substituent or substituents X of the benzene ring and an integer of 0 to 4).

3. The laminate according to claim 1, wherein the ethylenic unsaturated monomer having a tert-butoxycarbonyl group includes tert-butyl (meth) acrylate.

4. The laminate according to claim 1, wherein the adhesive layer is a film formed from an adhesive composition containing an adhesive component(S) containing at least one species selected from among a polysiloxane adhesive, an acrylic resin adhesive, an epoxy resin adhesive, a polyamide adhesive, a polystyrene adhesive, a polyimide adhesive, and a phenolic resin adhesive.

5. The laminate according to claim 4, wherein the adhesive component(S) contains a polysiloxane adhesive.

6. The laminate according to claim 5, wherein the polysiloxane adhesive contains a polyorganosiloxane component (A) which is curable through hydrosilylation.

* * * * *